(12) United States Patent
Pupalaikis et al.

(10) Patent No.: US 7,519,513 B2
(45) Date of Patent: *Apr. 14, 2009

(54) HIGH BANDWIDTH REAL TIME OSCILLOSCOPE

(75) Inventors: Peter J. Pupalaikis, Ramsey, NJ (US); David C. Graef, Campbell Hall, NY (US)

(73) Assignee: Lecroy Corporation, Chestnut Ridge, NY (US)

( * ) Notice: Subject to any disclaimer, the term of this patent is extended or adjusted under 35 U.S.C. 154(b) by 46 days.

This patent is subject to a terminal disclaimer.

(21) Appl. No.: 11/525,345

(22) Filed: Sep. 22, 2006

(65) Prior Publication Data

US 2007/0027658 A1 Feb. 1, 2007

Related U.S. Application Data

(63) Continuation of application No. 11/285,447, filed on Nov. 22, 2005, now Pat. No. 7,139,684, which is a continuation of application No. 10/693,188, filed on Oct. 24, 2003, now Pat. No. 7,058,548.

(60) Provisional application No. 60/420,937, filed on Oct. 24, 2002.

(51) Int. Cl.
*G01R 23/00* (2006.01)
*G06F 3/05* (2006.01)

(52) U.S. Cl. .................. 702/189; 702/75; 702/76; 341/155; 341/126

(58) Field of Classification Search .............. 702/189, 702/75, 76
See application file for complete search history.

(56) References Cited

U.S. PATENT DOCUMENTS

| 3,783,413 | A | | 1/1974 | Froment et al. |
|---|---|---|---|---|
| 3,891,803 | A | | 6/1975 | Daguet et al. |
| 3,903,484 | A | | 9/1975 | Testani |
| 4,316,282 | A | | 2/1982 | Macina |
| 5,469,219 | A | | 11/1995 | Mortensen |
| 5,519,342 | A | * | 5/1996 | McEwan ............... 327/94 |
| 5,659,546 | A | | 8/1997 | Elder |

(Continued)

FOREIGN PATENT DOCUMENTS

EP 0 275 136 7/1988

(Continued)

OTHER PUBLICATIONS

Real-Time Spectrum Analysis Tools Aid Transition to Third-Generation Wireless Technology; Tektronix, Inc. 1999, pp. 1-6.

(Continued)

*Primary Examiner*—Hal D Wachsman
(74) *Attorney, Agent, or Firm*—Frommer Lawrence & Haug LLP; William S. Frommer

(57) ABSTRACT

A method and apparatus for digitizing a data signal, the method comprising the steps of receiving an input analog data signal, splitting the received input analog data signal into a plurality of split signals, and mixing at least one of the split signals with a predetermined periodic function with a predetermined frequency. The split signals are then digitized and combined mathematically to form a single output data stream that is a substantially correct representation of the original input signal.

18 Claims, 23 Drawing Sheets

U.S. PATENT DOCUMENTS

| | | | |
|---|---|---|---|
| 5,668,836 | A | 9/1997 | Smith et al. |
| 5,937,006 | A * | 8/1999 | Clark et al. ................. 375/224 |
| 5,950,119 | A | 9/1999 | McGeehan et al. |
| 6,240,150 | B1 | 5/2001 | Darveau et al. |
| 6,271,773 | B1 | 8/2001 | Kobayashi |
| 6,340,883 | B1 | 1/2002 | Nara et al. |
| 6,380,879 | B2 | 4/2002 | Kober et al. |
| 6,567,030 | B1 | 5/2003 | Pupalaikis |
| 6,701,335 | B2 | 3/2004 | Pupalaikis |
| 6,731,922 | B1 * | 5/2004 | Strutz et al. ................. 455/302 |
| 7,058,548 | B2 * | 6/2006 | Pupalaikis et al. .......... 702/189 |
| 7,139,684 | B2 * | 11/2006 | Pupalaikis et al. .......... 702/189 |
| 2002/0150173 | A1 | 10/2002 | Buda |
| 2004/0041599 | A1 | 3/2004 | Murphy |

FOREIGN PATENT DOCUMENTS

EP    0 589 594    3/1994

OTHER PUBLICATIONS

A Matter of Time: Today's RF Signals Call for a Different Kine of Spectrum Analysis; Tektronix, Inc. 2000, pp. 1-8.
Signature™—High Performance Signal Analyzer 100 Hz to 8 GHz; Anritsu, 2000., pp. 1-2.
Agilent E5052A Signal Source Analyzer 10 MHz to 7 GHz; Agilent Technologies, Jun. 9, 2004, pp. 3 pages.
R3681 Signal Analyzer; Advantest, 2004, pp. 1-2.
RF Front-end Considerations for SDR Ultra-Wideband Communications Systems; Stephanie Paquelet et al.; RF Design, Jul. 2004, pp. 44, 46, 48, 50, 51.
On Perfect Reconstruction in Critically Sampled Frequency-Domain Scrambler; J.A. Apolinario, Jr., et al.; pp. 1-4.
Sampling and Reconstruction of Periodic Signals; Teodor Neagoe et al.; Apr. 2004, pp. 1-15.
Putting Undersampling to Work; Pentek, Inc.; pp. 1-2.
Reconstruction of Nonuniformly Sampled Bandlimited Signals by Means of Digital Fractional Delay Filters; Hakan Johansson et al.; IEEE Transactions on Signal Processing, vol. 50, No. 11, Nov. 2002; pp. 2757-2767.
Japanese Abstract of JP 06 197019—Hitachi Denshi Ltd.; Jul. 15, 1994.
High-Performance Advanced Filter Bank Analog-to-Digital Converter for Universal RF Receivers; Scott R. Velazquez, V Company; IEEE 1998; pp. 229-232.
Frequency Domain Approach for CMOS Ultra-Wideband Radios; Hyung-Jin Lee et al.; Proceedings for the IEEE Computer Society Annual Symposium on VLSI, 2003; pp. 1-2.
Frequency-Interleaving Technique for High-Speed A/D Conversion; G. Ding et al.; IEEE 2003; pp. 1-857-1-860.
Design of Hybrid Filter Banks for Analog/Digital Conversion; Scott R. Velazquez et al.; IEEE Transactions on Signal Processing, Vol. 46, No. 4, Apr. 1998; pp. 956-967.
Analog to Digital Conversion of Ultra-Wideband Signals in Orthogonal Spaces; Sebastian Hoyos et al.; IEEE 2003; pp. 47-51.
Understanding Digital Signal Processing; Richard G. Lyons; Prentice Hall Professional Technical Reference, Second Edition 2004; pp. 30-39; 346-360; 471-479; and 571-572.
Electronics Engineers' Handbook; Donald G. Fink et al.; McGraw Hill Book Company, First Edition 1975; pp. 4-32;14-28 to 14-29; 14-6514-69 and 22-30 to 22-31.
Real-Time Speech Frequency Scrambling and Descrambling (Undated), 17 pages.
Optional Block Function Library for Hypersignal® Block Diagram/RIDE; Advanced Transmission Library; Hyperception, Inc. 1997.

* cited by examiner

HIGH BANDWIDTH REAL TIME OSCILLOSCOPE

CROSS-REFERENCE TO RELATED APPLICATIONS

This application is a continuation of application Ser. No. 11/285,447 filed Nov. 22, 2005, now U.S. Pat. No. 7,139,684 which is a continuation of application Ser. No. 10/693,188, filed Oct. 24, 2003, now U.S. Pat. No. 7,058,548, and claims the benefit of U.S. Provisional Patent Application 60/420,937 filed Oct. 24, 2002, the entire contents of which are incorporated herein by reference.

FIELD OF THE INVENTION

The present invention relates to a high bandwidth real-time digital sampling oscilloscope (DSO) incorporating mixing (or heterodyning) to increase the bandwidth of a typical oscilloscope design with limited bandwidth.

BACKGROUND OF THE INVENTION

A digital sampling oscilloscope (DSO) is the primary tool utilized by engineers to view signals in electronic circuitry. As signals get ever faster, it is very beneficial to have DSOs capable of digitizing, displaying and analyzing these faster signals. The capability of a DSO to digitize fast signals is determined by its bandwidth and sample rate. The sample rate is the number of samples points taken of a waveform in a given amount of time and is inversely proportional to the sample period—the time between samples.

If a sinusoidal frequency sweep is performed from DC up to higher frequencies, the bandwidth is defined as the frequency at which the signal displayed on the DSO screen is approximately 30% smaller than the input sine-wave.

Since one of the uses of the DSO is to design and analyze new electronic devices, high end DSOs must operate at speeds much higher than the present state of the art in electronics. These speeds are generally unachievable through brute-force methods, such as simply providing ever-faster sampling chips, and many methods are employed to overcome this situation. One of the most common methods is a method inherent in the design of the original oscilloscope—that of triggering repeatedly on a periodic event. If an event is frequently, periodically repeating, the waveform at the time of the event can be repeatedly displayed on the screen. Furthermore, data from multiple trigger events average together to provide a good view of the waveform. This technique is the underlying method of a conventional sampling scope. A sampling scope repeatedly triggers on an event and acquires only a few points of the waveform (sometimes only one point of the waveform) on each trigger event. After repeated triggers, the points are reassembled according to the sampling algorithm to form a very high "effective" sample rate version of the waveform. Relatively low sample rates are utilized for each trigger event, and very high bandwidth samples may be generated. Furthermore, the repeated trigger events enable averaging, which can be utilized to increase the signal-to-noise ratio (SNR) and therefore enable further bandwidth increases. However, such a sampling scope presupposes a repetitive input signal so that the representation of the waveform can be generated over many triggers.

A common problem in complex signal analysis is that a signal that is to be analyzed is often not repetitive. In fact, it is very often the case that a non-repetitive event is the cause of some failure in an electronic system. It is the function of the test equipment to help the user identify the cause of the failure. Therefore, a piece of test equipment that requires repetitive signals is of limited usefulness. For example, sometimes the trigger event happens only once, such as in the analysis of bomb blasts. Frequently, however, the trigger event happens repeatedly, but the signal around the trigger event is different. Situations like this require a DSO capable of high bandwidth and sample rate with only a single trigger event. A DSO with these characteristics is called a real-time scope, and acquisitions taken utilizing only a single trigger event are called single-shot acquisitions. The distinction between the sampling scope and the real-time scope is an important one because the tricks that can be utilized to digitize a repetitive waveform are not available to the real-time DSO designer. In general, a real-time DSO is more useful because it does not require the input signal to be repetitive. However, the primary limitation is that the bandwidth of the real-time scope is limited.

In real-time DSO design, the method in common use for overcoming sample rate limitations is the method of interleaving. This method utilizes multiple digitizing elements that sample the same waveform at different points in time such that the waveform resulting from combining the waveforms acquired on these multiple digitizers forms a high sample rate acquisition. Most high-end real-time DSOs have very high sample rates achieved through the use of interleaving and most are capable of "oversampling" an input waveform.

Oversampling is defined as sampling a waveform at a rate whereby virtually no amount of signal content is present at a frequency above one half the sample rate. For example, a DSO with a bandwidth of 6 GHz that does not allow any signal in with a frequency at or above 10 GHz would be sufficiently sampling the waveform at a sample rate of 20 GHz. Any sampling of the waveform above this sample rate would result in an oversampled waveform. Oversampling is not inherently bad, just unnecessary because much more elegant methods can be utilized to produce the highly sampled waveform. The criteria for sufficiency of sample rate, outlined by Nyquist Criterion, states that if a waveform is sampled at a sufficient rate, than the exact analog waveform can be reconstructed. In other words, once the waveform is sufficiently sampled, the waveform can be reconstructed as if physically digitized at any sample rate.

Generally, in real-time DSOs, the interleaving is controlled through a method called channel combination. Combining channels means that the digitizing resources of multiple channels are utilized together to digitize a single waveform. Most often, channel combination is utilized to interleave multiple digitizers for the purpose of increasing the sample rate, but as the acquisition memory is generally connected to individual digitizers, this method is also utilized sometimes to increase the length of the acquisition.

While techniques are generally available for designing high sample rate systems, bandwidth is another issue. Bandwidth is typically dealt with through direct application of very high-speed electronics. In situations where electronics are simply not fast enough, usually the attainment of high bandwidth is achieved by making tradeoffs that the customer simply must accept. For example, higher bandwidth is achievable by removing protection circuitry at the front-end of the scope, thereby making it more susceptible to damage from static discharge or signal overdrive. Also, limitations are placed on the user regarding the range of input signals (to allow for attenuators and active gain components to be eliminated). The tradeoffs foisted on the scope user are often unpalatable, but endured reluctantly by the user with high-bandwidth requirements.

Despite this situation, the fact remains that attempts made to reach high bandwidths are often done at the expense of the overall usability of the scope. In other words, a high bandwidth scope can often not be utilized in a general-purpose manner. Finally, the fact remains that even with every possible trade-off, the bandwidth needs of the real-time scope user are sometimes so high as to be unachievable with the current state of the art.

SUMMARY OF THE INVENTION

This invention pertains generally to systems that digitize waveforms; and more specifically systems that convert an analog input signal to a digital output signal whereby the digital signal consists of an array of numbers that represent the amplitude of the analog waveform at known times. This invention also pertains to systems with limited bandwidth where there is a need for higher bandwidth. This invention therefore addresses systems incapable of accurately digitizing very rapidly changing signals.

The most specific application of this invention is to the high-end real-time DSO where extremely high demands are placed on the speed (and bandwidth) of signals digitized in a single-shot acquisition.

It is an object of the invention to demonstrate a method and apparatus whereby the bandwidth of a digitizing system can be increased.

As mentioned previously, channels are often combined within a DSO for the purpose of increasing the sample rate and acquisition memory length. This invention puts forth a method of utilizing channel combination for the purpose of increasing bandwidth.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

Figure 1:
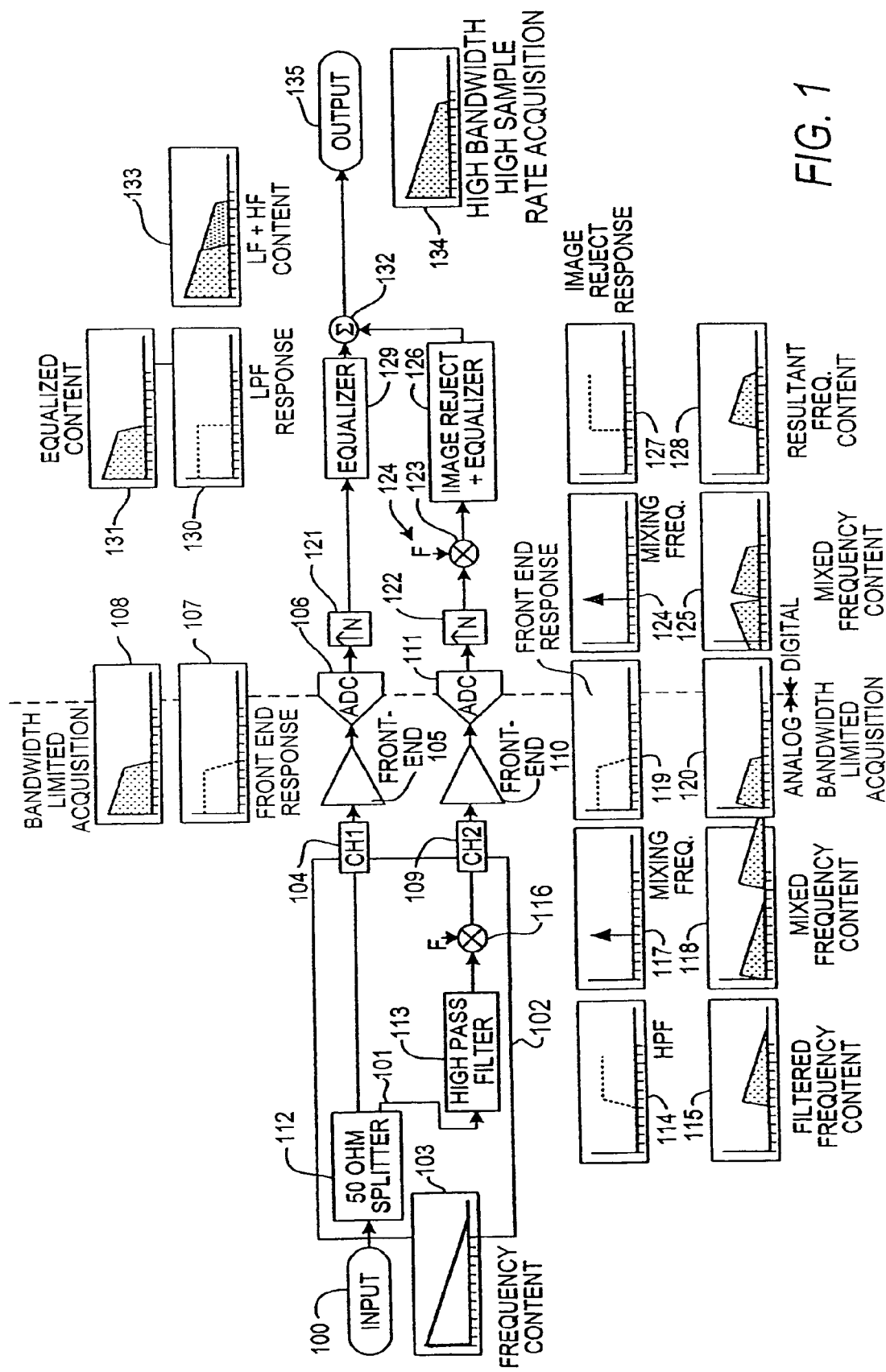
FIG. 1 is a block diagram depicting a digitizing system constructed in accordance with the invention.

FIG. 1 is a block diagram showing a high bandwidth digital oscilloscope architecture according to the present invention. FIG. 1 shows two channels of a DSO combined to digitize waveforms in a manner that effectively doubles the system bandwidth. It should be understood that the bandwidth can be tripled, quadrupled etc. by utilizing three, four or more channels in combination.

An input signal is provided at the input 100. Viewed from the frequency-domain perspective, the input signal might have a frequency content shown as 103. In a standard configuration input signal applied to input 100 directly enters a first channel, CH1 at 104. This signal passes through an analog front end 105, and on to an ADC 106 which digitizes the waveform. The channel has a finite bandwidth, as shown by 107 which results in a digitized waveform of finite bandwidth 108. For the purpose of future explanation, the cutoff frequency at which the bandwidth is limited is designated as F. In a conventional digitizer the CH1 channel (104) and a CH2 channel (109) are combined utilizing preferably an additional output of the CH1 channel (104) front-end (105) connected to an additional input of a CH2 channel ADC (111—connection not shown) for the purpose of doubling the sample-rate and memory length of the acquisition. A less preferable connection combines the channels through a 50 Ohm power splitter at the two channel inputs 104 and 109. Neither of these methods used in the current state of the art can increase the bandwidth. If there is any effect at all, it is to decrease the bandwidth somewhat. This is a side effect and not generally desired. The effect can be minimized with careful design.

The present invention involves the addition of additional analog circuitry 102 between the input 100 and the two channels 104 and 109 and downstream processing of the digital data to account for this additional hardware. In accordance with the present invention, the signal at the input 100 with example frequency content 103 enters a 50 Ohm power splitter 112. The splitter 112 provides the 50 Ohm termination to the input signal and provides at its two outputs, ideally the same signal attenuated. One output of splitter 112 directly connects to CH1 channel (104). The signal proceeds through front-end 105 and is digitized in the normal manner by ADC 106. Since the combination of front-end 105 and ADC 106 is bandwidth limited, as shown in 107, this results in a bandwidth limited acquisition with frequency content shown by 108. CH1 channel (104) is designated as containing the low frequency (LF) portion of the signal. The path through the other output of splitter will be described below and is designated as the high frequency (HF) path.

The addition of the splitter is the only additional component directly in the signal path of CH1 channel (104). In other words, the low frequency signal path with the splitter removed looks identical to the signal path of the DSO not utilizing this invention. Very high quality splitters with very high bandwidth are readily commercially available and as such, do not serve to degrade the signal path, except for possibly decreasing the signal strength.

The HF signal path will now be explained in greater detail. It is well known that frequencies can be shifted through the use of a process called mixing or heterodyning. This process is called "frequency translation". Mixing is achieved through the time-domain multiplication of a signal with another sinusoidal signal. It is well known that if a sinusoid with a frequency $f_0$ is mixed with another sinusoid with a frequency $f_1$, the result is two sinusoids at sum and difference frequencies (i.e. sinusoids at frequencies $f_0+f_1$ and $f_0-f_1$) with each sinusoid being half the amplitude of the product of the amplitudes of $f_0$ and $f_1$:

$$[A_0 \cdot \cos \cdot (2 \cdot \pi \cdot f_0)] \cdot [A_1 \cdot \cos(2 \cdot \pi \cdot f_1)] \rightarrow$$
$$\frac{A_0 \cdot A_1}{2} \cdot [\cos(2 \cdot \pi \cdot (f_0 + f_1)) + \cos(2 \cdot \pi \cdot (f_0 - f_1))]$$

In order to utilize these principles, the signal from the second output 101 of splitter 112 enters a high pass filter 113. High-pass filter 113 is designed to reject to the greatest extent possible all frequencies below frequency F as shown in 114. The result of high pass filtering the input signal with frequency content as shown in 103 is shown in 115. The output of 113 is mixed with a sinusoid at frequency F utilizing mixer 116. The result of mixing the signal with frequency content shown by 115 with the mixing frequency F shown in 117 is the frequency content shown in 118. 118 shows that two images of the content shown in 115 are produced at the sum and difference frequencies, as noted above. In cases where the cutoff of the high-pass filter is inadequate, the mixing frequency could be chosen slightly higher such that a dead-band is utilized to prevent the low frequency edges of the high-pass filter output from folding back into the pass-band. Any increase in mixing frequency, while providing margin, will also serve to degrade the maximum bandwidth achievable.

The output of mixer 116 connects to CH2 channel (109)—the high frequency channel. The signal passes through a front-end 110 and is digitized by an ADC 111. Since like CH1 channel (104), the combination of front-end 110 and ADC 111 is bandwidth limited, as shown in 119 this results in a bandwidth limited acquisition with frequency content shown by 120.

The acquisition through ADCs 106 and 111 occur simultaneously in parallel, so channels CH1 and CH2 are simultaneously acquired.

To summarize, the signals seen at the inputs to each of the channels are as follows. The LF CH1 channel (104) sees the input waveform directly. The HF CH2 channel (109), sees only the frequency content in the frequency band extending upward from F. Through the use of heterodyning, it sees the frequency content of the input signal at F+ΔF at the frequency location ΔF. Thus, the input signal has been mixed down. Although there were two images (seen in 118), the second image (and part of the first image) were rejected due to the finite channel bandwidth 119. Said differently, the LF CH1 channel acquires the low frequency content of the input signal from 0-F, while the HF CH2 channel acquires the frequency content of the input signal from F-2·F. This signal is mixed down from frequency band F–>2*F to the range of 0–>F so it "fits" into the bandwidth of the front end. It can be seen that twice the frequency content of the signal has been made to "fit" into the bandwidth of the scope.

Both the LF and HF signals are digitized by the scope in the normal manner. It is assumed that both channels are sufficiently sampling with respect to the channel bandwidth. In other words, each channel is sampling at a sample rate (Fs) such that virtually no frequency content can get through the channels above Fs/2. This might be accomplished through the use of internally interleaving channel digitizers or through the combination of other channels, as mentioned previously. Since a sufficiently sampled channel allows for the complete reconstruction of the signal at any sample rate, each channel is upsampled to a sample rate that at least sufficiently samples the resulting acquisition utilizing upsamplers 121 and 122. In the case where a channel is just sufficiently sampling based on the frequency response of the channel, the acquisition on each channel is upsampled by a factor of 2 when two channels are combined, since the system bandwidth will be effectively doubled in the end. This upsampling is performed utilizing a method such as SinX/X interpolation to interpolate every other sample point. The method and validity of this method of interpolation is well known to those skilled in the art.

The data from the HF CH2 channel is mixed at a mixer 123 digitally (i.e. numerically using a software program and floating point arithmetic) with a sinusoid with the same frequency F (124) as utilized by analog mixer 116 in the analog HF signal path. The result of mixer 123 is two images of the HF signal shown by 125. Each image appears at frequencies from 0-F and from F-2·F. The first, low frequency image is mirrored about F and is unusable. The second image is a replica of the actual high frequency content of the input signal. The output of digital mixer 123 passes through an image reject filter 126, which has a frequency response shown by 27. The result is the frequency content shown in 128.

The result at this point is two digital waveforms, one representing the low frequency portion of the input signal 131 and the other representing the high frequency portion of the input signal 128.

Since both signals passed through an imperfect channel, they are equalized separately to compensate for non-ideal magnitude and phase characteristics of the front-end and digitizing systems. The equalizer for the CH1 channel (129) is shown with its response 130 being an ideal low-pass filter. This results in no change between the frequency content shown in 108 and the equalized content shown in 131 with the understanding that this would not necessarily be the case if there were imperfections in the signal 131. The equalizer for the CH2 channel is shown integrated with the image reject filter 126. Both equalizers also have the difficult job of preparing the signals to accommodate the cross-over from LF to HF.

Finally, the waveform resulting from the LF channel equalizer 129 is added to the waveform resulting from the HF channel equalizer 126 by the summer 132. The result of this addition is shown by adding the LF frequency content in 131 to the HF content in 128, shown graphically in 133. This forms a high-bandwidth, high-sample rate acquisition at the output 135 with the frequency content as shown in 134.

A detailed numerical example stepping through this process is provided below.

To summarize the effect, the input signal with frequency content 103 normally would be digitized by one channel to form an acquisition with frequency content shown in 108. Instead, as a result of this invention, two channels were utilized and the resulting acquisition as twice the bandwidth as demonstrated by the signal frequency content shown in 134. Note that the two other benefits of interleaving—that of doubling the sample rate and memory length are still achieved by this invention.

Figure 2:
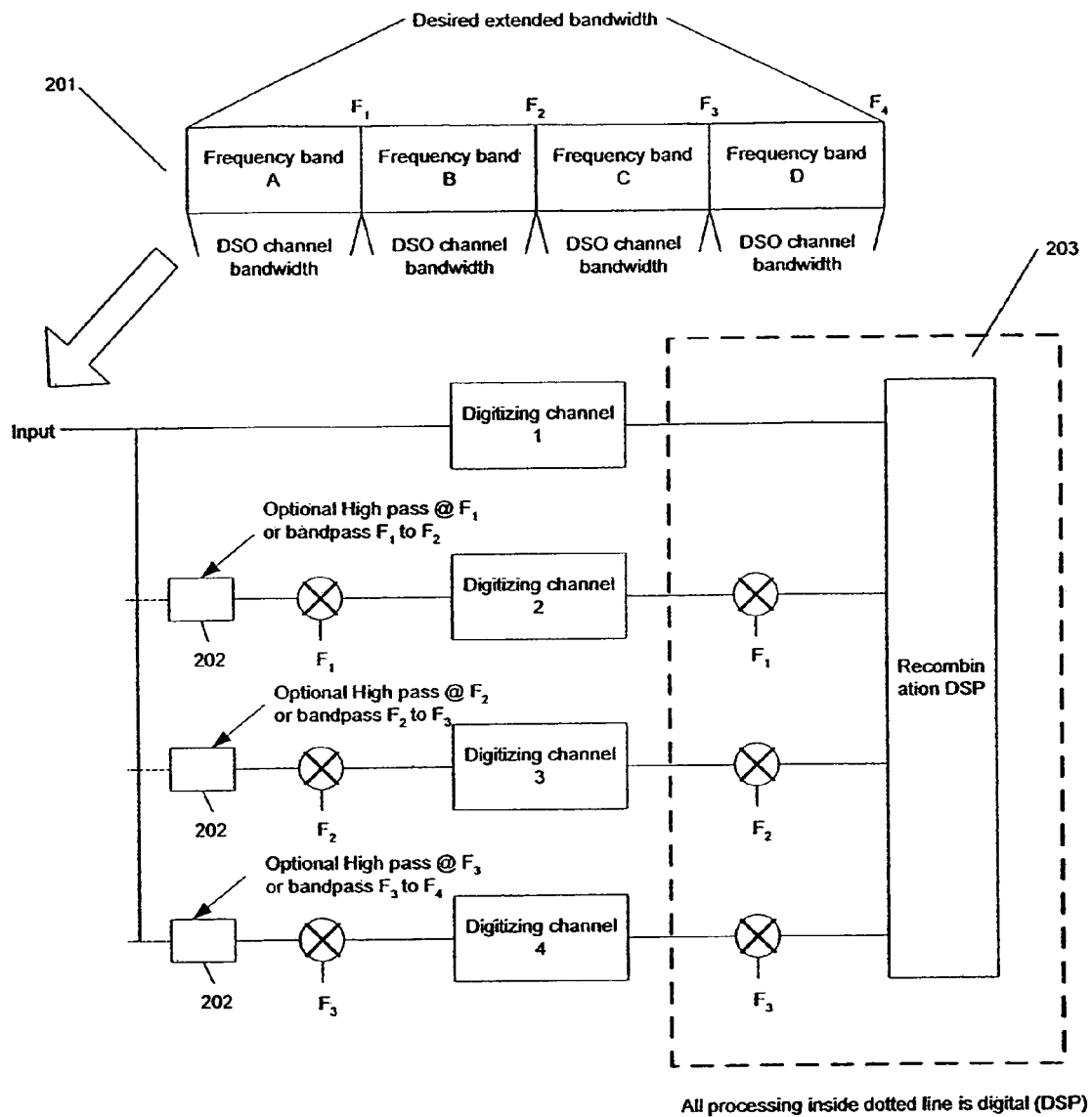
FIG. 2 is a block diagram showing one possible method of the extension of this technique to 4 channels using a mixing frequency that is at the low side of the frequency band of interest (low side conversion)

Multiple channels could be combined in similar arrangements whereby the system bandwidth is increased by a factor equal to the number of combined channels. An example showing how this technique may be used to extend the bandwidth four times using four channels is shown in FIG. 2. FIG. 2 depicts a low side conversion. In this case, each frequency band in 201 (A, B, C & D) is translated down to be digitized by channels 1, 2, 3 and 4 respectively. The filter blocks shown (202) are optional. The goal is to sufficiently isolate the desired frequency band. This can be done, in this example, using a highpass filter, a bandpass filter or no filter at all. In the case of no filter, there will be "images" of the adjacent frequency band that will be digitized by the channel. These can be removed using DSP techniques in the recombination DSP block (203). This recombination technique is shown for a high side conversion (using three channels) below.

Figure 3:
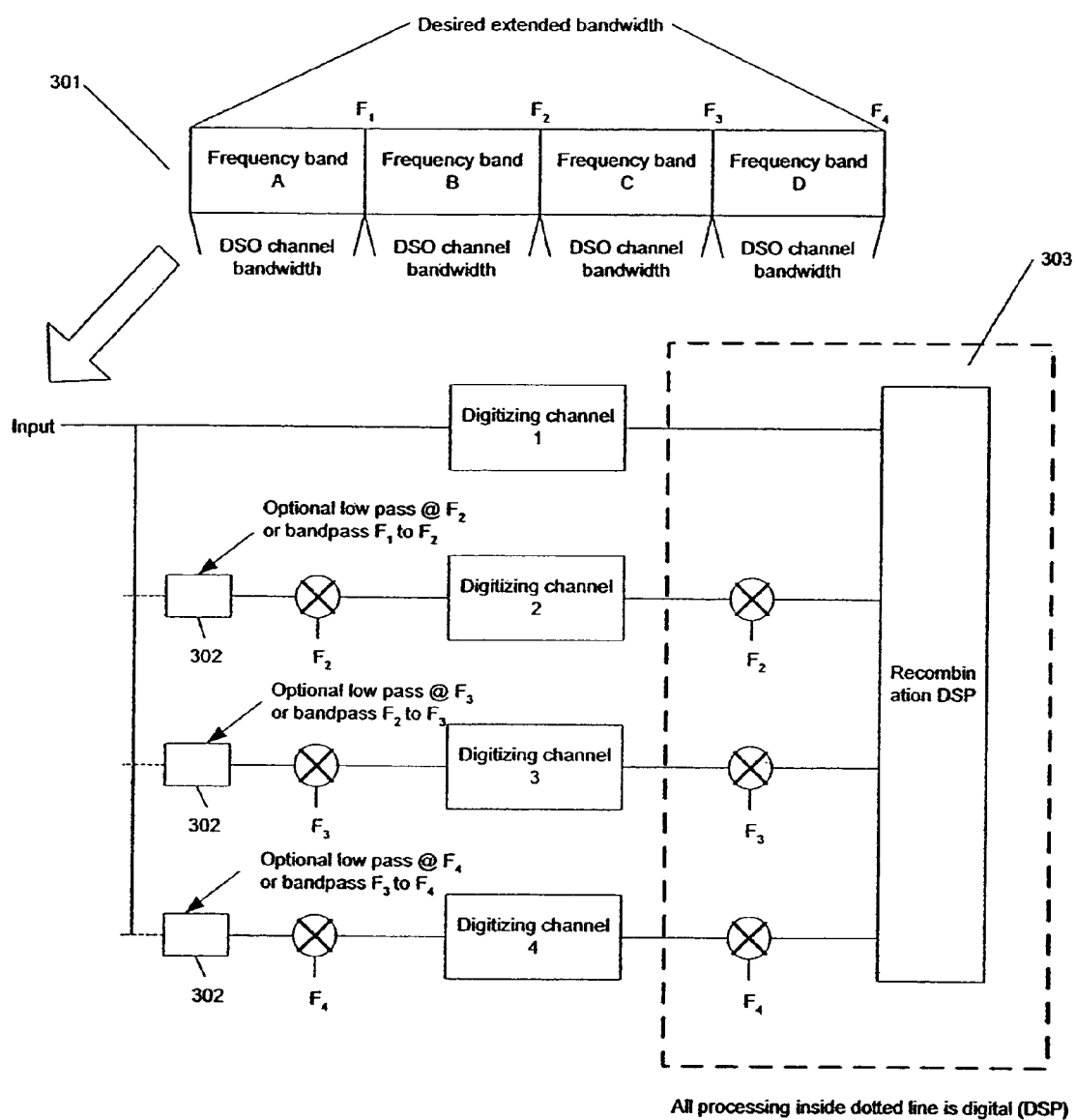
FIG. 3 is a block diagram showing another possible method of the extension of this technique to 4 channels using a mixing frequency that is at the high side of the frequency band of interest (high side conversion)

Another example of how this technique can be applied is shown in FIG. 3. FIG. 3 depicts a high side conversion. Careful inspection of FIG. 3 will show that the major difference between FIG. 2 and FIG. 3 is the frequency used to "translate" the frequency band of interest into the frequency band of the acquisition channel. FIG. 2 uses a frequency on the low side of the band of interest ($F_1$ to translate frequency band "B" to the frequency band of the acquisition system) and FIG. 3 uses a frequency on the high side of the band of interest ($F_2$ to translate frequency band "B" to the frequency band of the acquisition system). Note that the translated frequency band is "reversed" if high side conversion is used. That is, the highest frequency in frequency band "B" ($F_2$) becomes the lowest frequency in the translated band. This will be corrected in the reconstruction by using $F_2$ as the up-conversion frequency in the DSP reconstruction of the signal. This recombination technique is shown for a high side conversion (using two channels) below.

In either case shown in FIGS. 2 and 3, it is required that the phase of the translation frequency is known in order to reconstruct the original signal. This can be accomplished, by example, by summing a pilot tone into the signal channel, or locking the mixer phase to the sample clock.

EXAMPLES

The first example shows how a step can be digitized using two 5 GHz bands and low side downconversion.

$rt := .045$     Risetime of edge specified (ns).

$f_{bw} := \frac{0.344}{rt}$   $f_{bw} = 7.644$     Bandwidth of critically damped second order system.

$\omega 0 := 1.5542 \cdot \pi \cdot f_{bw}$     Calculate the center frequency for the system.

$\frac{\omega 0}{2 \cdot \pi} = 11.879$     Center frequency (GHz).

$TD := 5$     Time delay for step edge (ns).

$H(s) = \frac{\omega 0^2}{\left(s^2 + \frac{\omega 0}{Q} \cdot s + \omega 0^2\right) \cdot s} \cdot e^{-s \cdot TD}$     Laplace transform of the step specified.

The inverse Laplace transform provides the time-domain step waveform.

$f(t) := if[t<TD, 0, [-1-\omega 0 \cdot (t-TD)] \cdot e^{[-\omega 0 \cdot (t-TD)]} + 1]$ To simulate the behavior of the analog components, it is modeled digitally with an extremely high sample rate.

$FS_{hi} := 1000$     Sample rate for stimulating analog system (GHz).

$KH := 10000$   $kh := 0 \ldots KH - 1$ $th_{kh} := \frac{kh}{FS_{hi}}$     Time of each point (ns).

Utilize a raised cosine window to minimize effects of the FFT.

$wh_{kh} := \frac{1}{2} - \frac{1}{2} \cdot \cos\left(2 \cdot \pi \cdot \frac{kh}{KH-1}\right)$ $xh_{kh} := f(th_{kh}) \cdot wh_{kh}$     Calculate the windowed step.

$t_{10} := \frac{.53181160838961202015}{\omega 0} + TD$   $t_{10} = 5.007$ $t_{90} := \frac{3.8897201698674290579}{\omega 0} + TD$   $t_{90} = 5.052$ $t_{90} - t_{10} = 0.045$     Verify that restime is correct.

Figure 4:
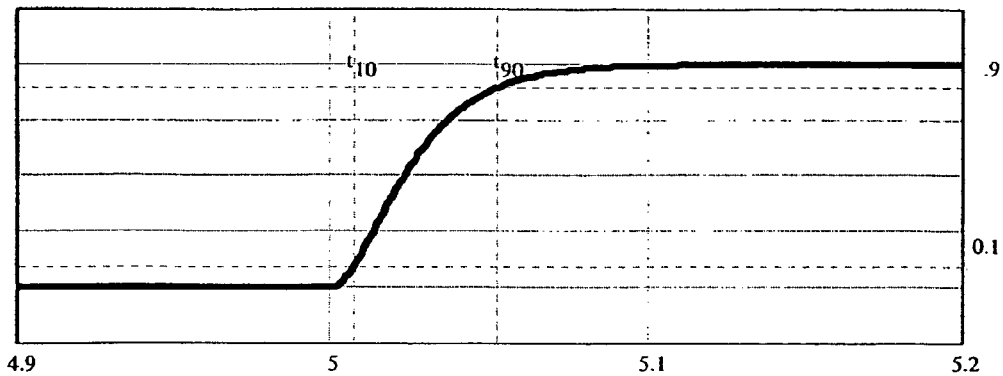
FIGS. 4-57 are waveform diagrams of signals input to and output from the processing circuits described herein, and are useful in explaining the advantages obtained by the present invention.

FIG. 4 shows a picture of the simulated 45 ps step.

$Xh := CFFT(xh)$     Calculate the FFT.

Figure 5:
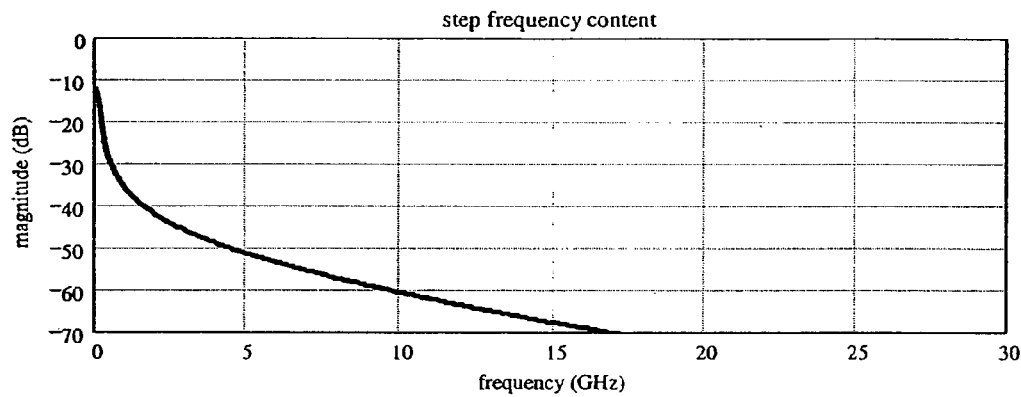

$NH := \frac{KH}{2}$    $nh := 0 \ldots NH$ $fh_{hn} := \frac{nh}{NH} \cdot \frac{FS_{hi}}{2}$ FIG. 5 shows the frequency content of the simulated step.

As we know, the scope does not have the bandwidth to digitize this signal. Therefore, we apply the method of this invention. First, we will utilize a system bandwidth of 5 GHz. then, we develop bandpass filters that select 5 GHz bands of the signal. Note that because the system is bandlimited, it is not actually necessary to utilize bandpass filters—only high pass filters need be utilized, but bandpass filters are used to simplify the discussion. Furthermore, the first band does not even need a filter—the scopes limited bandwidth will do this for us. (inside the scope, a digital low pass filter would be utilized to provide the hard bandwidth limiting).

BW:=5 System bandwidth utilized for each band (GHz).

Make low pass and bandpass filters for each band.

Figure 6:
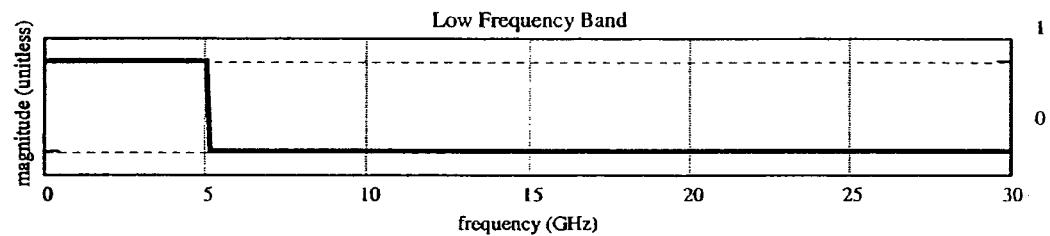
Figure 7:
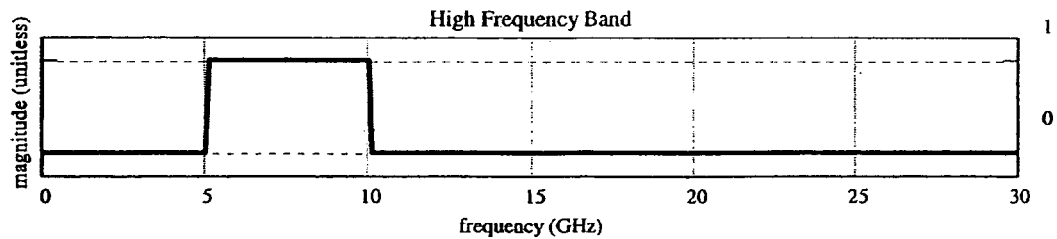

$nn := 1 \ldots NH - 1$ $Mfl_{nh} := if\ (fh_{nh} \leq BW, 1, 0)$    $Mfh_{nh} := if\ (BW < fh_{nh} \leq 2 \cdot BW, 1, 0)$ $Mfl_{NH+nh} := Mfl_{NH-nn}$    $Mfh_{NH+nn} := Mfh_{NH-nn}$ FIG. 6 shows the response of the low frequency band filter.
FIG. 7 shows the response of the high frequency band filter.

Apply these filters to the input waveform.

Figure 8:
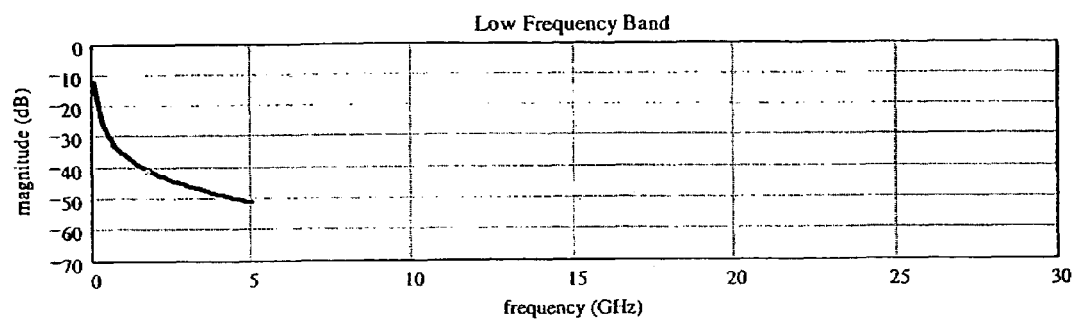
Figure 9:
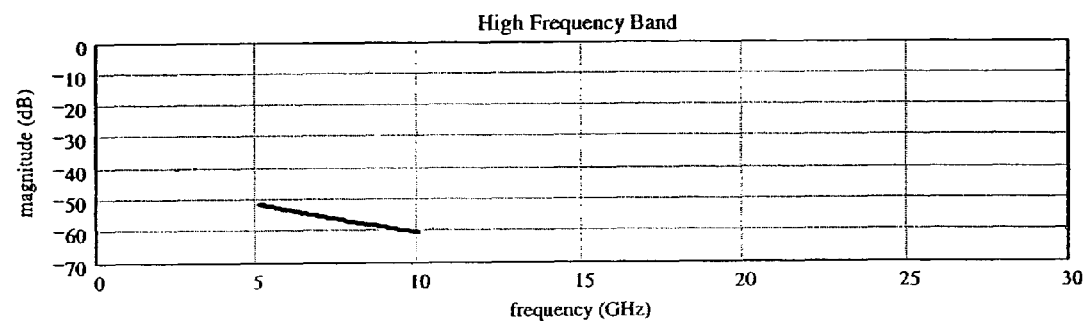

$Xfl := \overrightarrow{(Xh \cdot Mfl)}$   $Xfh := \overrightarrow{(Xh \cdot Mfh)}$   $Xf := \overrightarrow{(Xh \cdot M)}$ FIG. 8 shows the frequency domain result of applying the low frequency band filter to the simulated step.
FIG. 9 shows the frequency domain result of applying the high frequency band filter to the simulated step.

Calculate the inverse FFT of these filtered bands.

$xfl := ICFFT(Xfl)$   $xfh := ICFFT(Xfh)$   $xf := ICFFT(Xf)$

Figure 10:
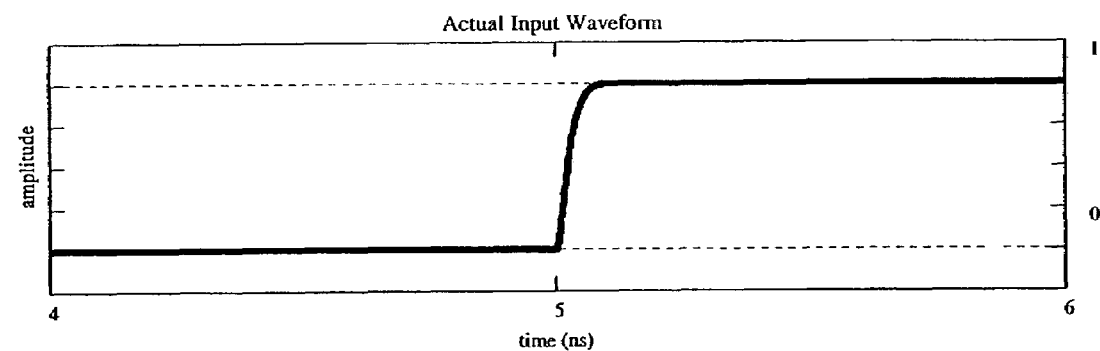
Figure 11:
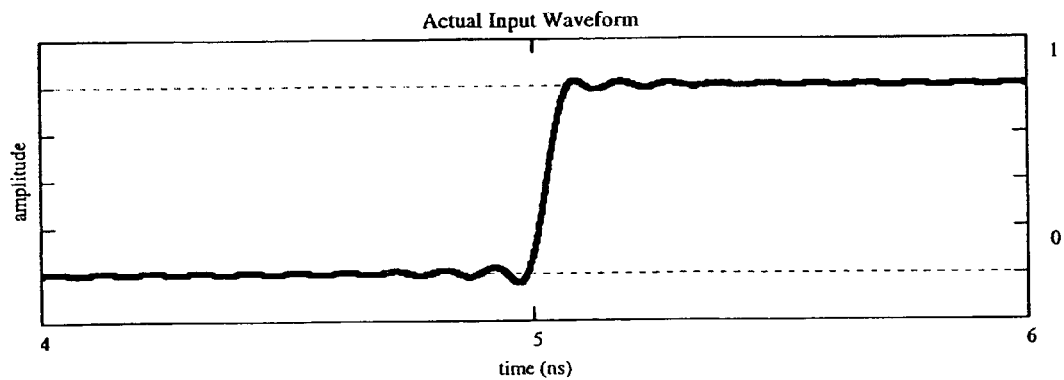
Figure 12:
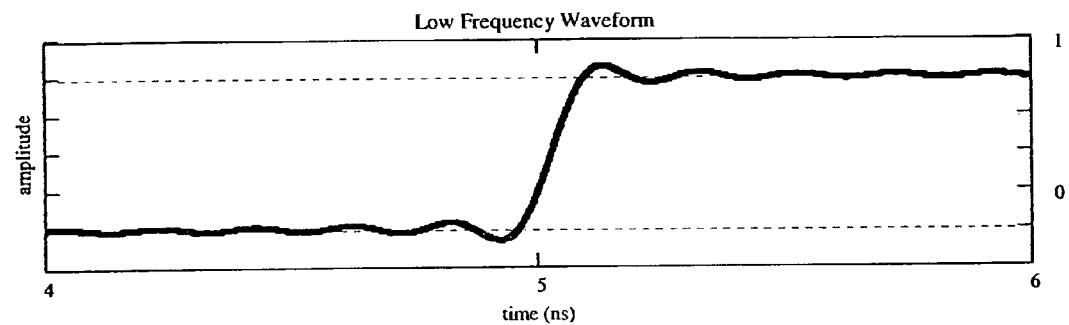
Figure 13:
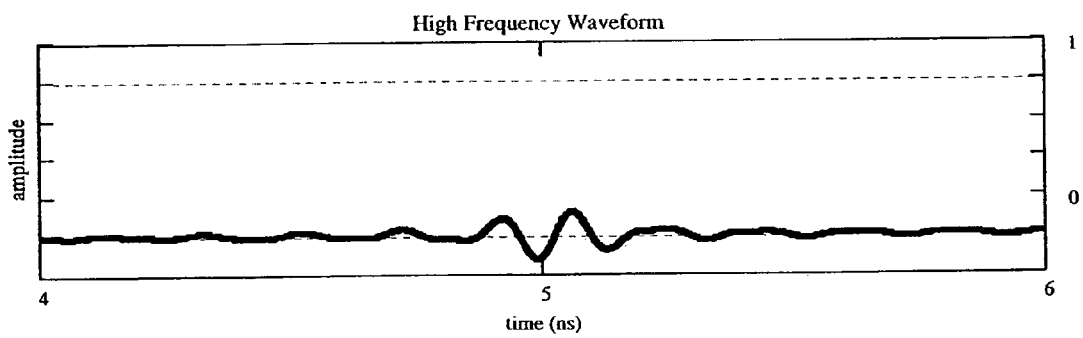

FIG. 10 shows the input waveform.
FIG. 11 shows the input waveform bandlimited to 10 GHz.
FIG. 12 shows the time domain result of applying the low frequency band filter to the simulated step.
FIG. 13 shows the time domain result of applying the high frequency band filter to the simulated step.

Figure 14:
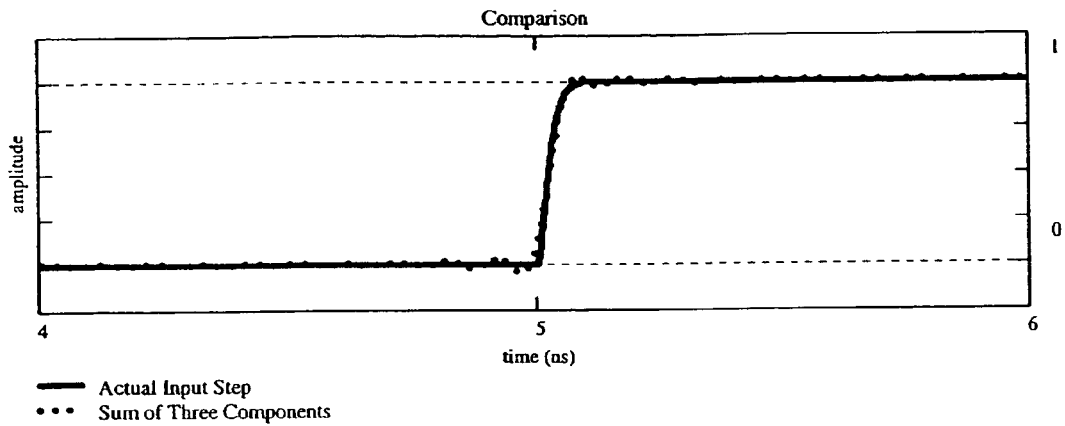

It is useful to add these two signals together and compare them to the input waveform. FIG. 14 shows this. You will note the sum is not identical to the input because the system has limited the bandwidth at 10 GHz. The 10 GHz bandwidth limited signal is the best that we will be able to provide.

Figure 15:
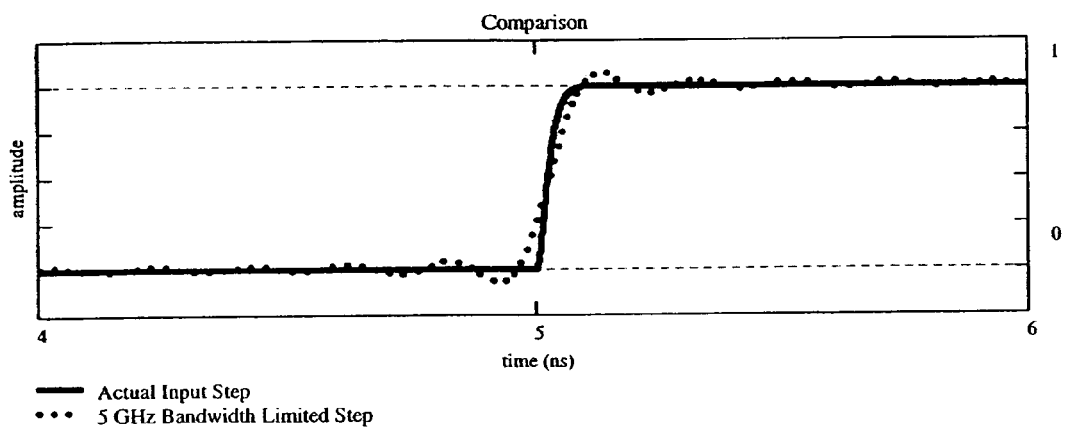

It is also useful to compare the low frequency and actual input waveforms directly. FIG. 15 shows this. The point of FIG. 15 is to demonstrate the problem that this invention is designed to solve. The limited bandwidth slows the edge of the step. This simulates the analog waveform that gets sampled by a digitizer with a front-end bandwidth of 5 GHz. Our goal is to digitize the actual waveform with a much higher bandwidth.

First, the high frequency band is applied to the mixer.

$$F_{mixer0} := 1 \cdot BW \quad \Phi_{mixer0} := rnd(2 \cdot \pi)$$

The frequency of the high frequency mixer is at the cutoff frequency of the first band.

Apply the mixer.

$$xfhm_{kh} := xfh_{kh} \cdot 2 \cdot \cos(2 \cdot \pi \cdot F_{mixer0} t^h_{kh} + \Phi_{mixer0})$$

Look at the frequency content.

$$Xfhm := CFFT(xfhm)$$

Low pass filter the mixer outputs.

$$Xfhml := \overrightarrow{(XfhmMfl)}$$

Figure 16:
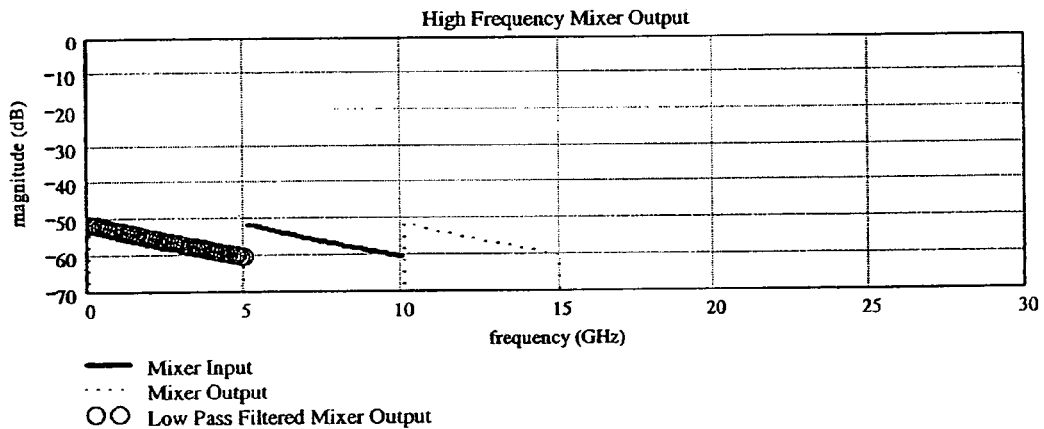

Note again that the typical manner of low pass filtering the mixer outputs would be to use the scope front-end. This filtering is being shown here as actual low pass filters applied. FIG. 16 shows the effect at the high frequency band mixer and image reject filter output in the frequency domain.

Take the inverse FFT to generate the analog mixer output signals—the analog signals input to the channel digitizers.

$$xfhml := ICFFT(Xfhml)$$

Figure 17:
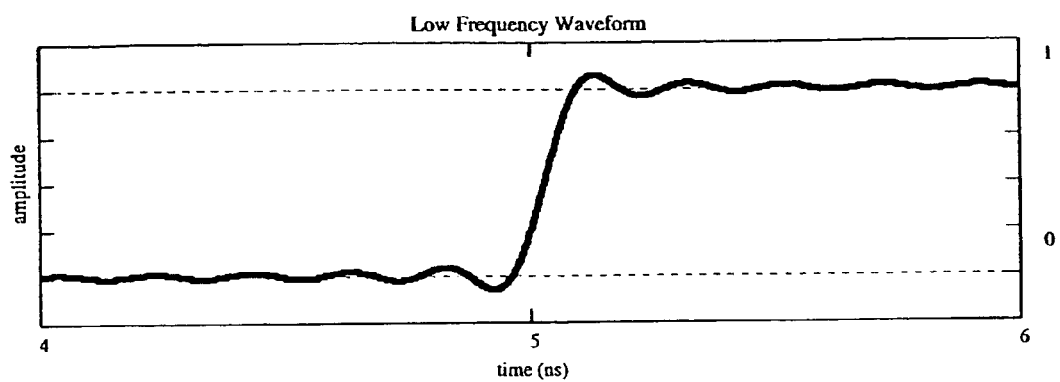
Figure 18:
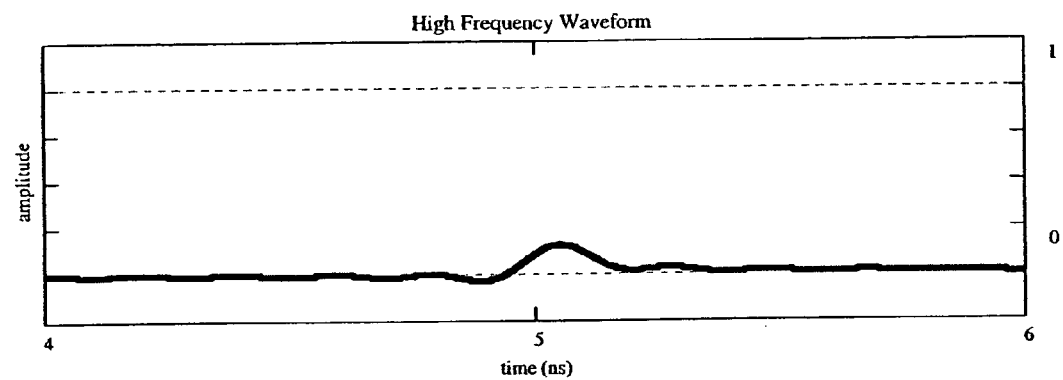

FIGS. 17 and 18 show the low frequency and high frequency band signal due to the processing of the simulated step input signal.

Figure 19:
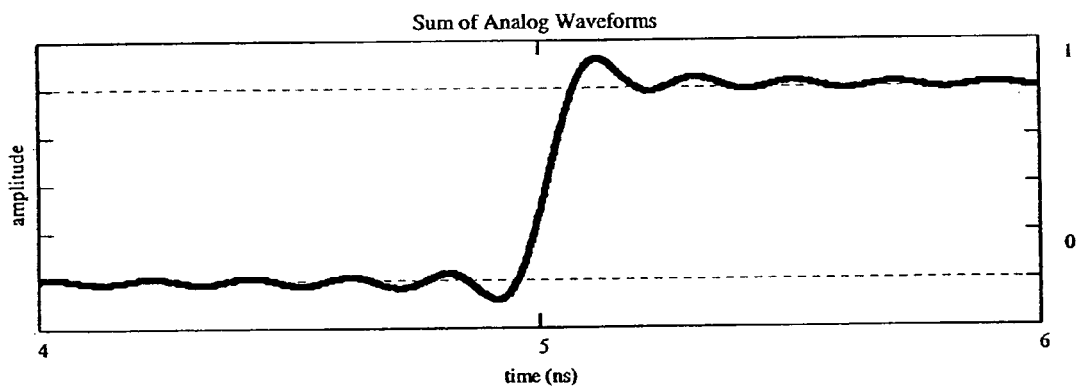

It is interesting to see what the sum of these two waveforms is—their sum does not produce anything useful. This is shown in FIG. 19. This is shown to exemplify that further processing of the digitized waveforms is required to achieve the objective.

At this point, the waveforms are digitized. The waveforms must be sampled at a rate sufficient to satisfy Nyquist Criterion. For this example, this means that they must be sampled at at least 2 times BW, or 10 GS/s. After the waveforms have been digitized, they are immediately upsampled using SinX/x interpolation. This is possible because all digitized waveforms are bandlimited. It is useful to upsample the waveforms to a sample rate capable of meeting Nyquist Criterion for the system bandwidth—I have chosen 40 GS/s. The upsampling is trivial and for the purpose of this example, I simply use a 40 GS/s digitizer with the understanding that the exact same waveform would result from sampling the waveform at 10 GS/s and upsampling by a factor of 4.

$$FS := 40 \quad \text{Unsampled digitizer sample rate.}$$

$$D := \frac{FS_{hi}}{FS} \quad D = 25 \quad \text{Unsampling factor for analog waveform model.}$$

$$K := \frac{KH}{D} \quad k := 0 \ldots K-1$$

Sample the waveforms.

$$t_k := \frac{k}{FS} \quad x_{l_k} := xfl_{k \cdot D} \quad x_{h_k} := xfhml_{k \cdot D} \quad x_k := xh_{k \cdot D} \quad w_k := wh_{k \cdot D}$$

Generally, at this point, we would apply the sharp cutoff filter. If a sharp cutoff analog filter was not used, we'd have to satisfy Nyquist Criterion such that any extra frequency content would not fold back into the 5 GHz band. I've already applied a sharp cutoff filter to the analog signal, so this is not necessary.

Also, at this point, some magnitude and phase compensation would probably be necessary to account for non-ideal channel frequency response characteristics. This example shows the signal digitized with ideal digitizers with ideal frequency response characteristics. Next, the high and very high frequency waveforms are mixed up to there appropriate frequency location and digitally bandpass filtered.

Note that these digital mixers know the phase of the analog mixers—some mechanism must be provided for determining this—either through a pilot tone or locking of the mixer phase to the sample clock.

Apply digital mixers.

$$x_{hm_k} := x_{h_k} \cdot (2 \cdot \cos(2 \cdot \pi \cdot F_{mixer0} f_k + \Phi_{mixer0}))$$

Bandpass filter the mixer outputs.

$$N := \frac{K}{2} \qquad n := 0 \ldots N$$

$$f_n := \frac{n}{N} \cdot \frac{FS}{2}$$

$$Xhm := CFFT(x_{hm}) \qquad Xlm := CFFT(x_l)$$

$$Xfhm_n := \text{if } (f_n < 1 \cdot BW, 0, Xhm_n) \quad Xflm_n := \text{if } (f_n > 2 \cdot BW, 0, Xfhm_n)$$

$$nn := 1 \ldots N-1$$

$$Xfhm_{N+nn} := \overline{Xfhm_{N-nn}}$$

$$X_h := CFFT(x_h) \qquad X_l := CFFT(x_l)$$

Figure 20:
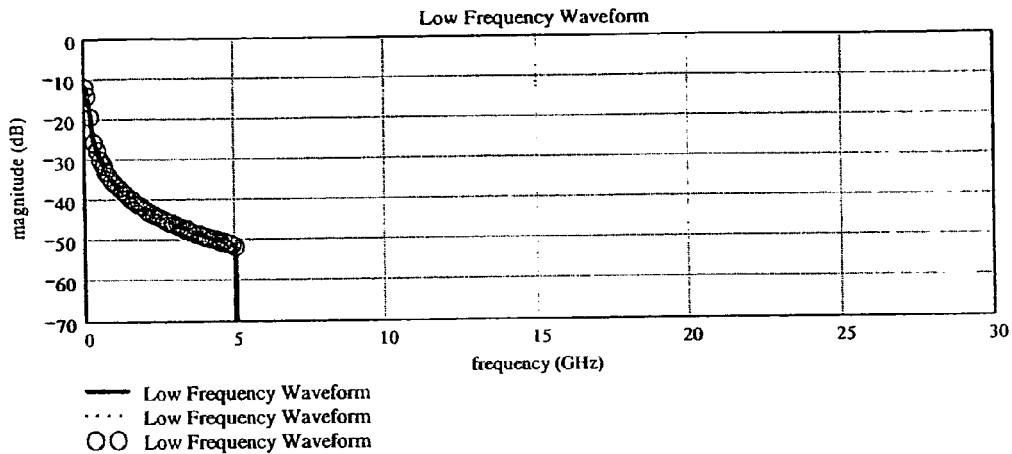

FIG. 20 shows the low frequency band waveform frequency content.

Figure 21:
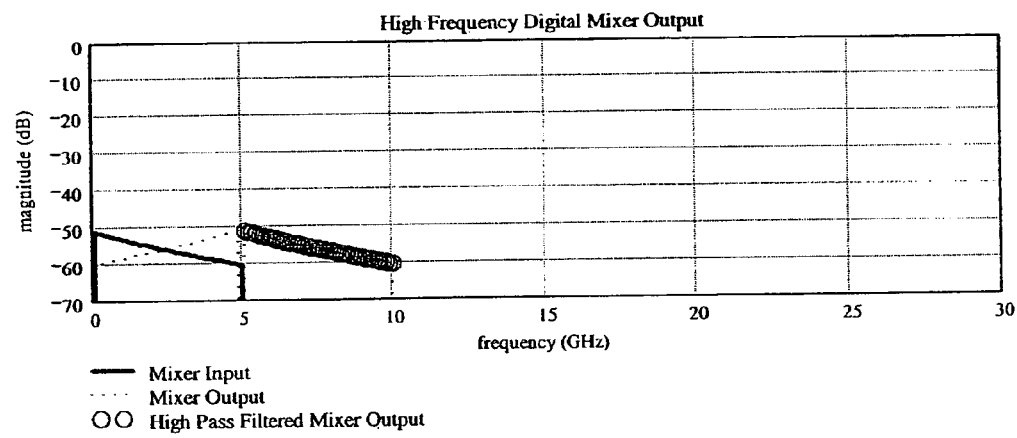

FIG. 21 shows the high frequency band waveform frequency content before and after digital mixing and filtering.

Figure 22:
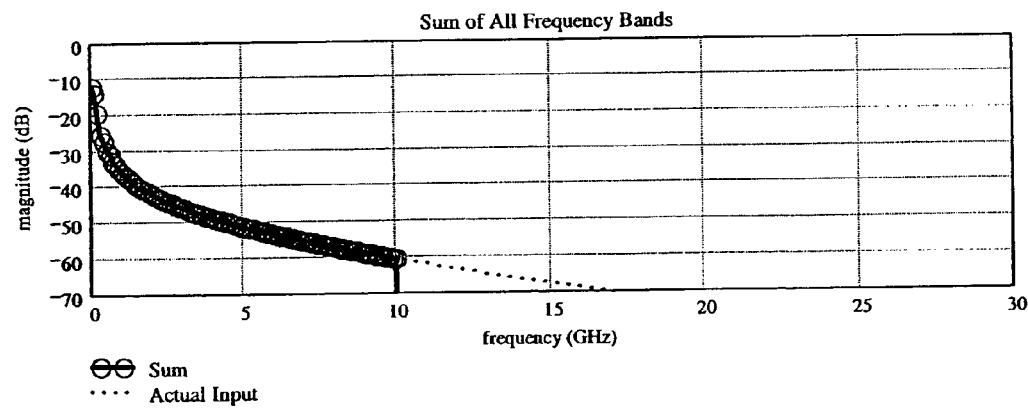

FIG. 22 shows the results of summing the output waveforms. We have acquired the waveform with a 10 GHz bandwidth utilizing two 5 GHz bandwidth channels.

Now let's see how the time domain waveforms compare.

$$xfhm := Re(ICFF(Xfhm))$$

Figure 23:
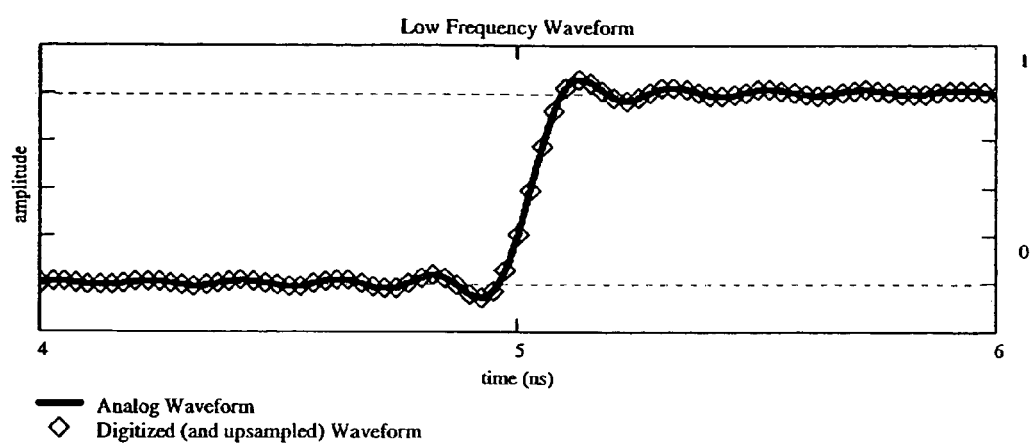

FIG. 23 shows a comparison of the analog low frequency portion of the input waveform to the digitized and processed low frequency waveform result. FIG. 23 shows that these are identical.

Figure 24:
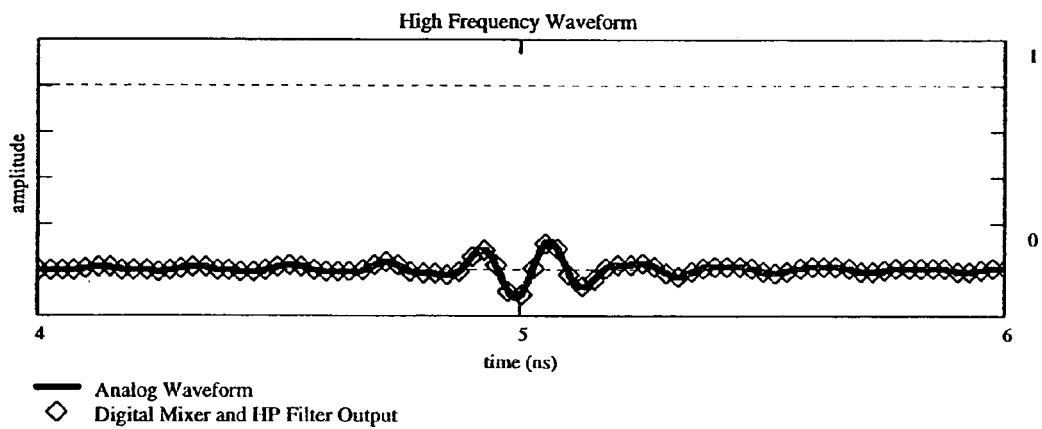

FIG. 24 shows a comparison of the analog high frequency portion of the input waveform to the mixed, digitized and digitally remixed and processed high frequency waveform result. FIG. 24 shows that these are identical.

Figure 25:
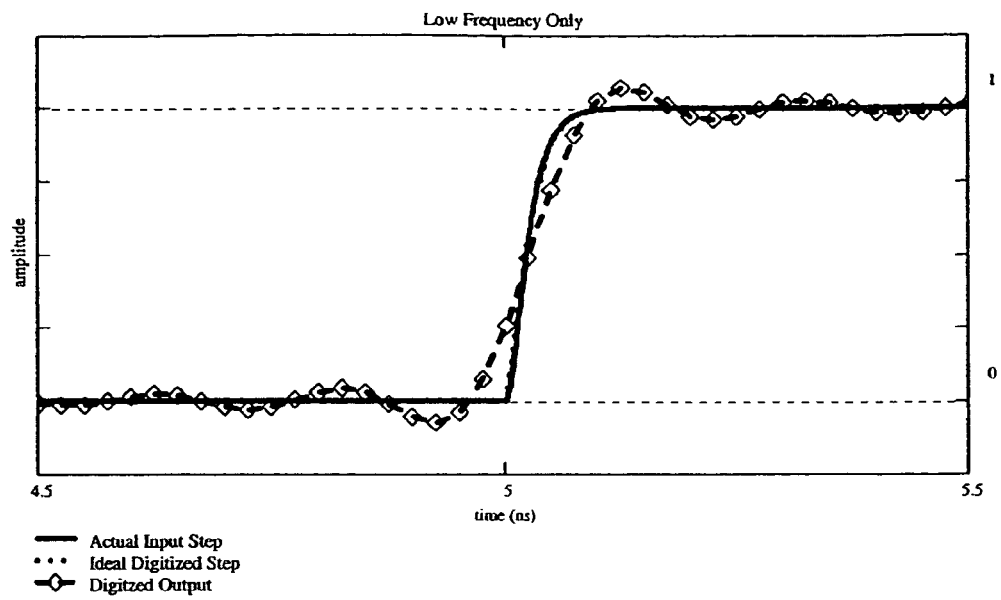
Figure 26:
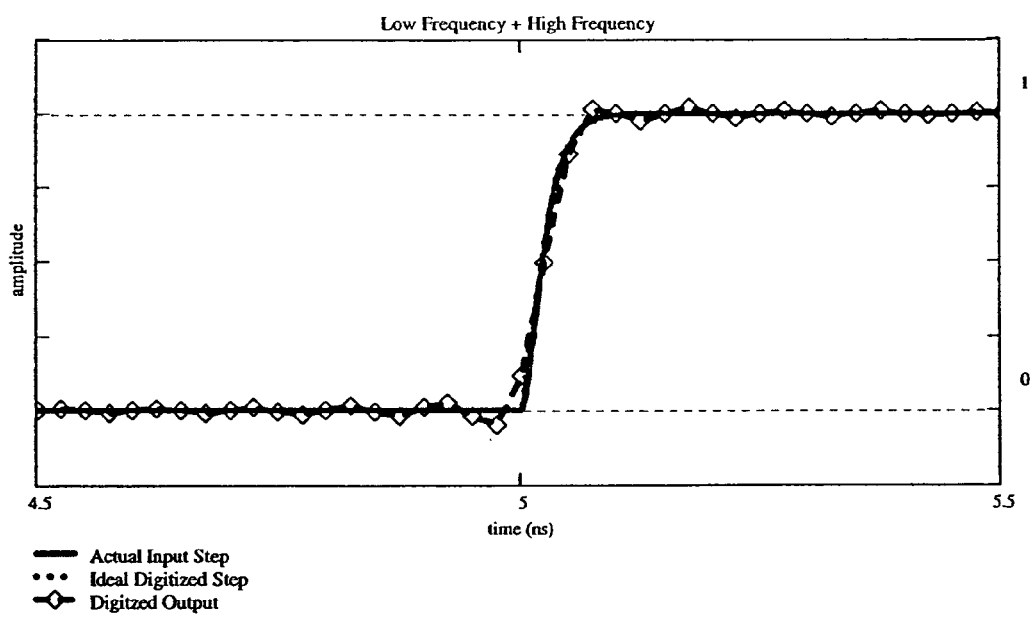

FIGS. 25 and 26 show how successive addition of the processed band outputs causes the resulting waveform to more and more closely approximate the input waveform.

FIG. 26 shows that the result is identical to the input waveform band limited to 10 GHz and shows that the 10 GHz bandwidth limited step is fully recreated.

The second example shows how a step can be digitized using three 5 GHz bands and high side downconversion.

$rt = .035$      Risetime of edge specified (ns).

$f_{bw} = \dfrac{0.344}{rt}$      $f_{bw} = 9.829$ $\omega 0 = 1.5542 \cdot \pi \cdot f_{bw}$      Calculate the center frequency for the system.

$\dfrac{\omega 0}{2 \cdot \pi} = 15.274$      Center frequency (GHz).

$TD = 5$      Time delay for step edge (ns).

$H(s) = \dfrac{\omega 0^2}{\left(s^2 + \dfrac{\omega 0}{Q} \cdot s + \omega 0^2\right) \cdot s} \cdot e^{-s \cdot TD}$      Laplace transform of the step specified.

The inverse Laplace transform provides the time-domain step waveform.

$f(t) = if[t<TD, 0, [-1-\omega 0 \cdot (t-TD)] \cdot e^{[-\omega 0 \cdot (t-TD)]} + 1]$ To simulate the behavior of the analog components, it is modeled digitally with an extremely high sample rate.

$FS_{hi} = 1000$      Sample rate for simulating analog system (GHz).

$KH = 10000$      $kh = 0 \ldots KH - 1$ $th_{kh} = \dfrac{kh}{FS_{hi}}$      Time of each point (ns).

Utilize a raised cosine window to minimize effects of the FFT.

$wh_{kh} = \dfrac{1}{2} - \dfrac{1}{2} \cdot \cos\left(2 \cdot \pi \cdot \dfrac{kh}{KH - 1}\right)$ $xh_{kh} = f(th_{kh}) \cdot wh_{kh}$      Calculate the windowed step.

$t_{10} = \dfrac{.53181160838961202015}{\omega 0} + TD$      $t_{10} = 5.006$ $t_{90} = \dfrac{3.8897201698674290579}{\omega 0} + TD$      $t_{90} = 5.041$ $t_{90} - t_{10} = 0.035$      Verify that risetime is correct.

Figure 27:
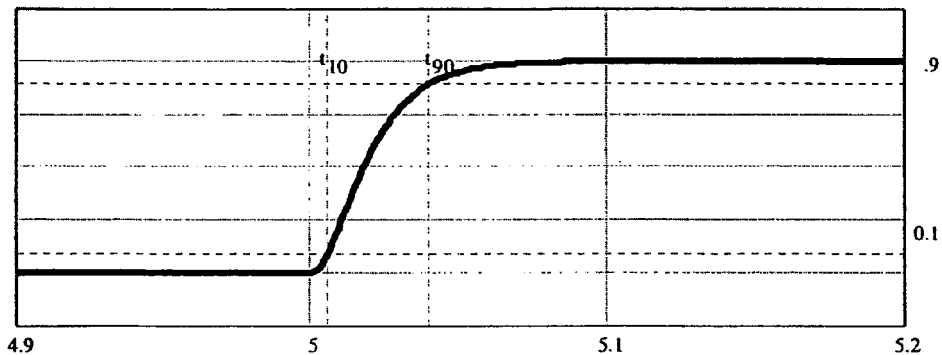

FIG. 27 shows a picture of the simulated 35 ps step.

$Xh = CFFT(xh)$      Calculate the FFT.

Figure 28:
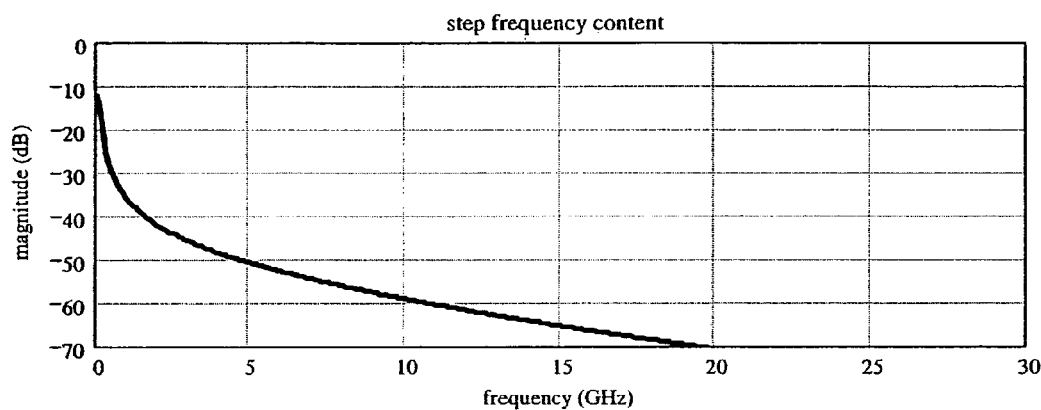

$NH = \dfrac{KH}{2}$      $nh = 0 \ldots NH$      $fh_{nh} = \dfrac{nh}{NH} \cdot \dfrac{FS_{hi}}{2}$ FIG. 28 shows the frequency content of the simulated step.

As we know, the scope does not have the bandwidth to digitize this signal. Therefore, we apply the method of this invention. First, we will utilize a system bandwidth of 5 GHz. Then, we develop bandpass filters that select 5 GHz bands of the signal. Note that because the system is bandlimited, it is not actually necessary to utilize bandpass filters—only high pass filters need be utilized, but bandpass filters are used to simplify the discussion. Furthermore, the first band does not even need a filter—the scopes limited bandwidth will do this for us. (inside the scope, a digital low pass filter would be utilized to provide the hard bandwidth limiting).

$BW = 5$ System bandwidth utilized for each band (GHz).

Make low pass and bandpass filters for each band.

Figure 29:
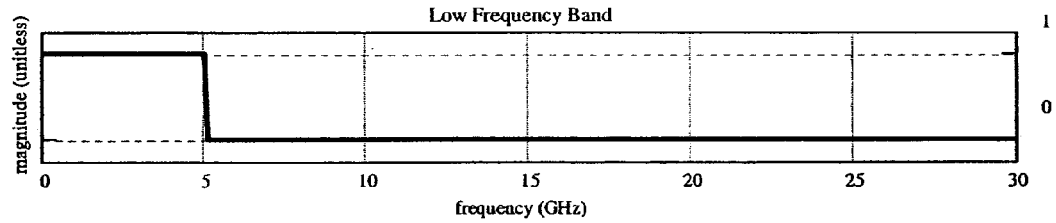

$nn = 1 \ldots NH - 1$ $Mfl_{nh} = if(fh_{nh} \leq BW, 1, 0)$    $Mfl_{NH+nn} = Mfl_{NH-nn}$ FIG. 29 shows the response of the low frequency band filter.

Figure 30:
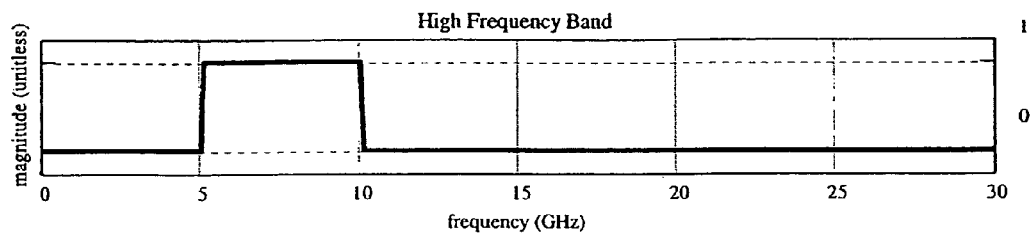

$Mfh_{nh} = if(BW < fh_{nh} \leq 2 \cdot BW, 1, 0)$    $Mfh_{NH+nn} = Mfh_{NH-nn}$ FIG. 30 shows the response of the high frequency band filter.

Figure 31:
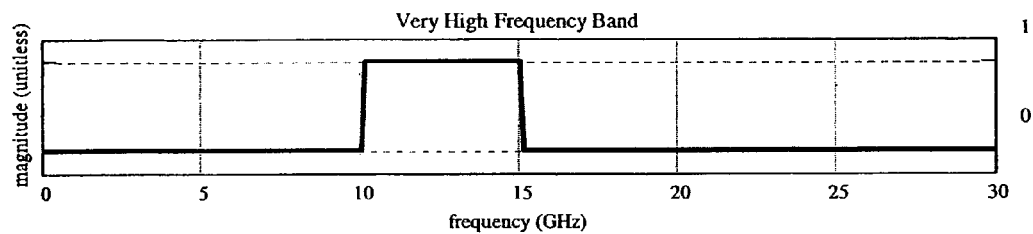

$Mfhh_{NH+nn} = Mfhh_{NH-nn}$    $Mfhh_{nh} = if(2 \cdot BW < fh_{nh} \leq 3 \cdot BW, 1, 0)$ FIG. 31 shows the response of the very high frequency band filter.

Apply these filters to the input waveform.

Figure 32:
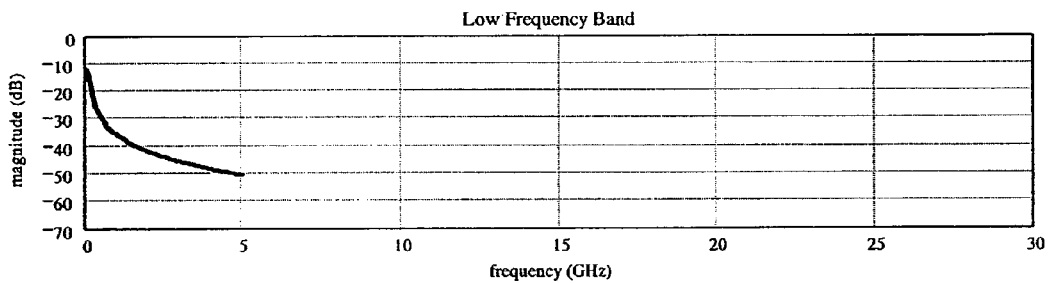

$Xfl = \overrightarrow{(Xh \cdot Mfl)}$    $Xfh = \overrightarrow{(Xh \cdot Mfh)}$    $Xfhh = \overrightarrow{(Xh \cdot Mfhh)}$    $Xf = \overrightarrow{(Xh \cdot M)}$ FIG. 32 shows the frequency domain result of applying the low frequency band filter to the simulated step.

Figure 33:
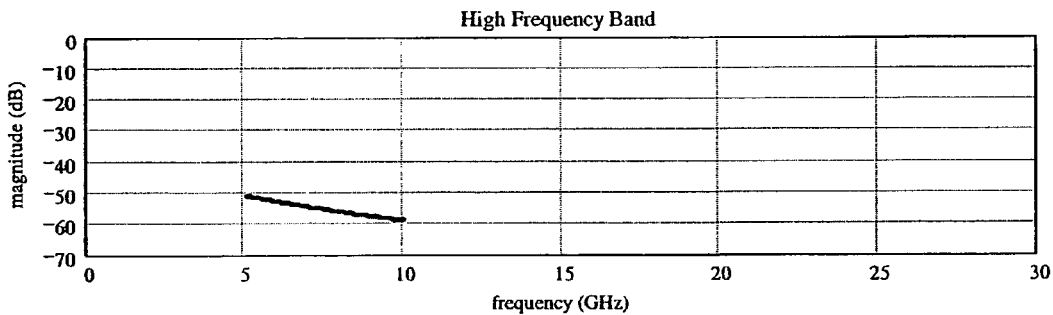
Figure 34:
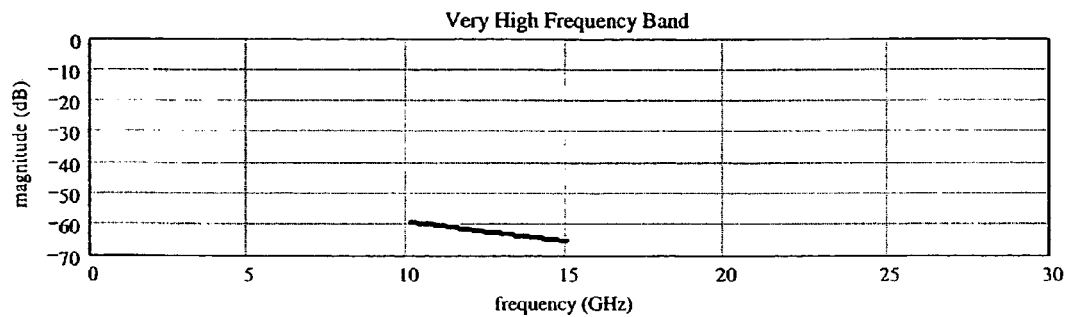

FIG. 33 shows the frequency domain result of applying the high frequency band filter to the simulated step FIG. 34 shows the frequency domain result of applying the very high frequency band filter to the simulated step.

Calculate the inverse FFT of these filtered bands.

Figure 35:
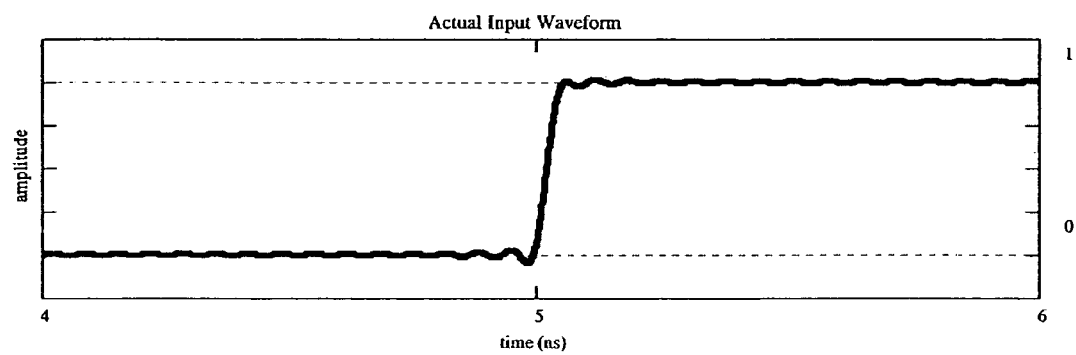

$xfl = ICFFT(Xfl)$    $xfh = ICFFT(Xfh)$    $xfhh = ICFFT(Xfhh)$
$xf = ICFFT(Xf)$ FIG. 35 shows the band limited input waveform.

Figure 36:
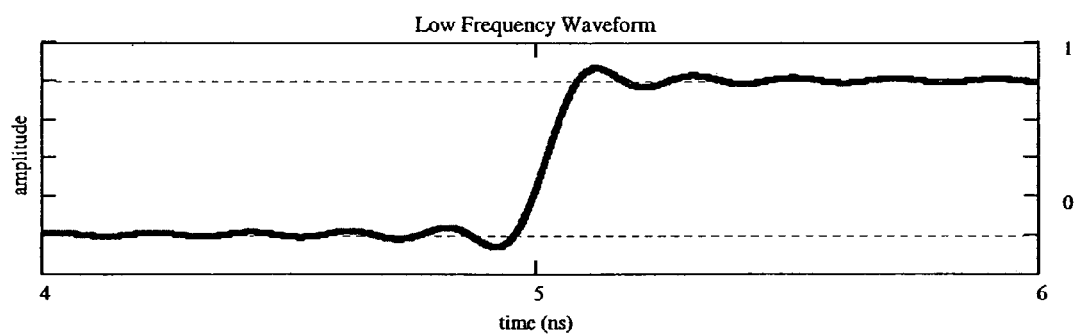

FIG. 36 shows the time domain result of applying the low frequency band filter to the simulated step.

Figure 37:
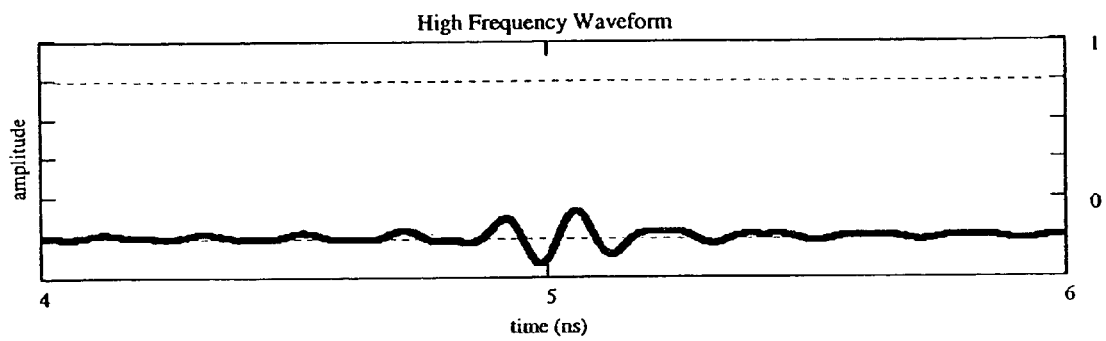

FIG. 37 shows the time domain result of applying the high frequency band filter to the simulated step.

Figure 38:
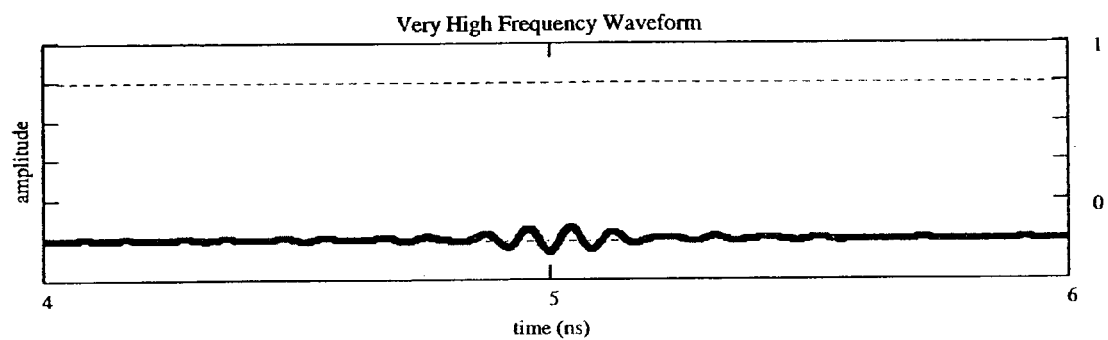

FIG. 38 shows the time domain result of applying the very high frequency band filter to the simulated step.

Figure 39:
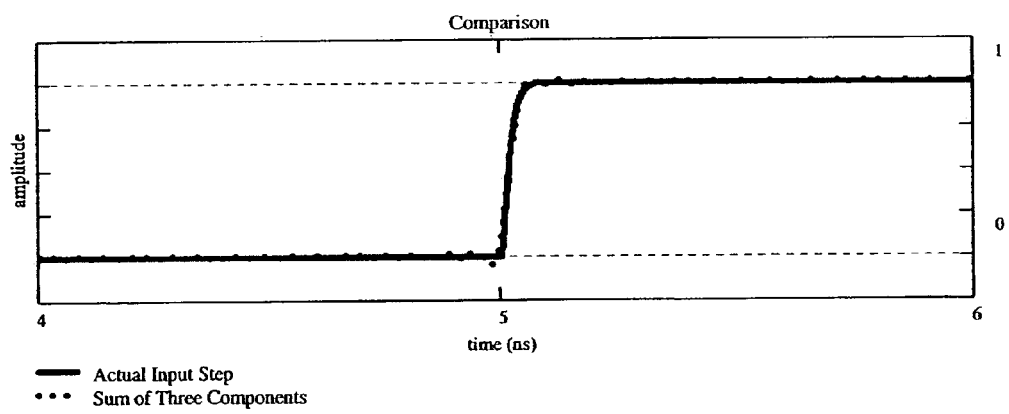

It is useful to add these three signals together and compare them to the input waveform. FIG. 39 shows this. You will note the sum is not identical to the input because the system has limited the bandwidth at 15 GHz. The 15 GHz bandwidth limited signal is the best that we will be able to provide.

Figure 40:
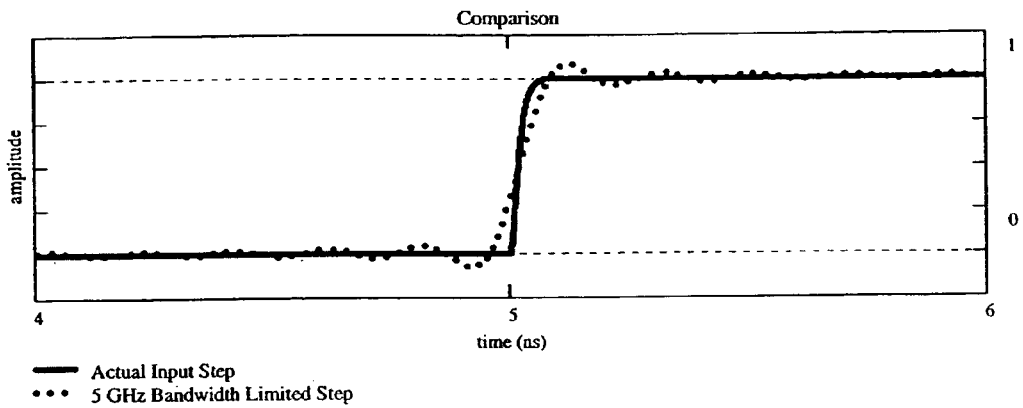

It is also useful to compare the low frequency and actual input waveforms directly. FIG. 40 shows this. The point of FIG. 40 is to demonstrate the problem that this invention is designed to solve. The limited bandwidth slows the edge of the step. This simulates the analog waveform that gets sampled by a digitizer with a front-end bandwidth of 5 GHz.

Our goal is to digitize the actual waveform with a much higher bandwidth. First, the high frequency and very high frequency bands are applied to the mixers.

$$F_{mixer0} = BW \quad \Phi_{mixer0} = rnd(2 \cdot \pi)$$

The frequency of the high frequency mixer is at the twice the cutoff frequency of the first band. The frequency of the very high frequency mixer is three times the cutoff frequency of the first band.

$$F_{mixer1} = 2 \cdot BW$$

$$\Phi_{mixer1} = rnd(2 \cdot \pi)$$

Apply the mixers.

$$xfhm_{kh} = xfh_{kh} \cdot 2 \cdot \cos(2 \cdot \pi \cdot F_{mixer0} t^h_{kh} + \Phi_{mixer0})$$
$$xfhhm_{kh} = xfhh_{kh} \cdot 2 \cdot \cos(2 \cdot \pi \cdot F_{mixer1} t^h_{kh} + \Phi_{mixer1})$$

Look at the frequency content.

$$Xfhm = CFFT(xfhm) \quad Xfhhm = CFFT(xfhhm)$$

Low pass filter the mixer outputs.

$$Xfhml = \overrightarrow{(XfhmMfl)} \quad Xfhhml = \overrightarrow{(XfhhmMfl)}$$

Note again that the typical manner of low pass filtering the mixer outputs would be to use the scope front-end. This filtering is being shown here as actual low pass filters applied.

Figure 41:
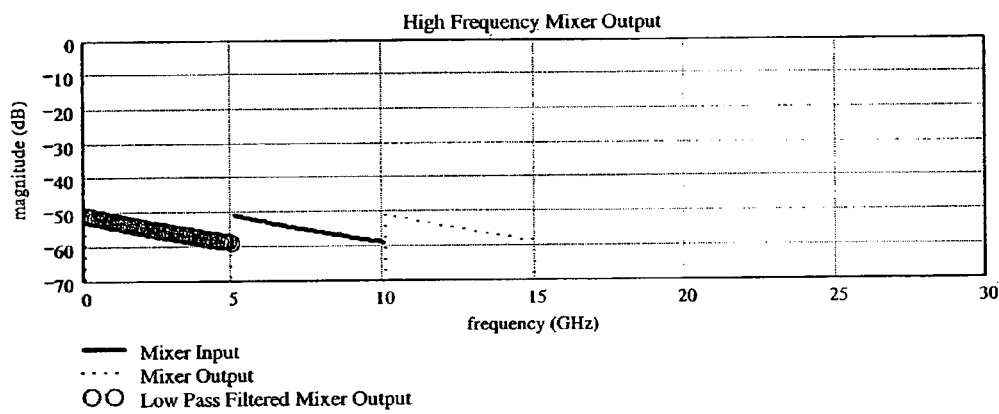

FIG. 41 shows the effect at the high frequency band mixer and image reject filter output in the frequency domain.

Figure 42:
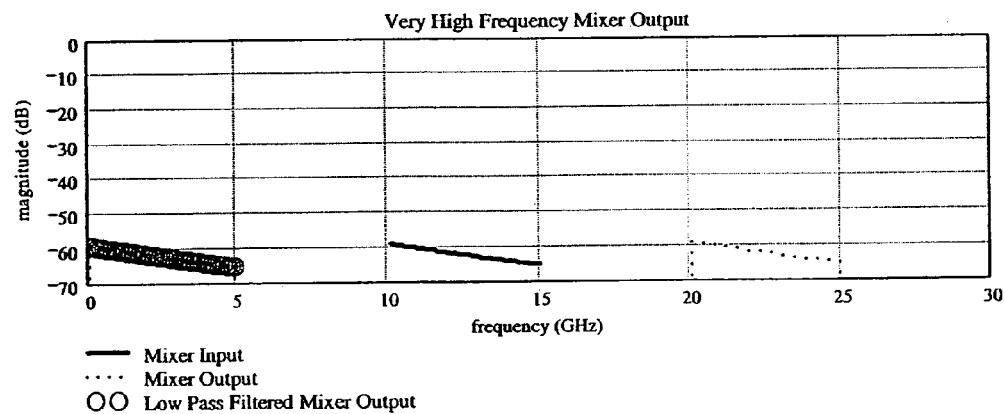

FIG. 42 shows the effect at the very high frequency band mixer and image reject filter output in the frequency domain.

Take the inverse FFT to generate the analog mixer output signals—the analog signals input to the channel digitizers.

$$xfhml = ICFFT(Xfhml) \quad xfhhml = ICFFT(Xfhhml)$$

Figure 43:
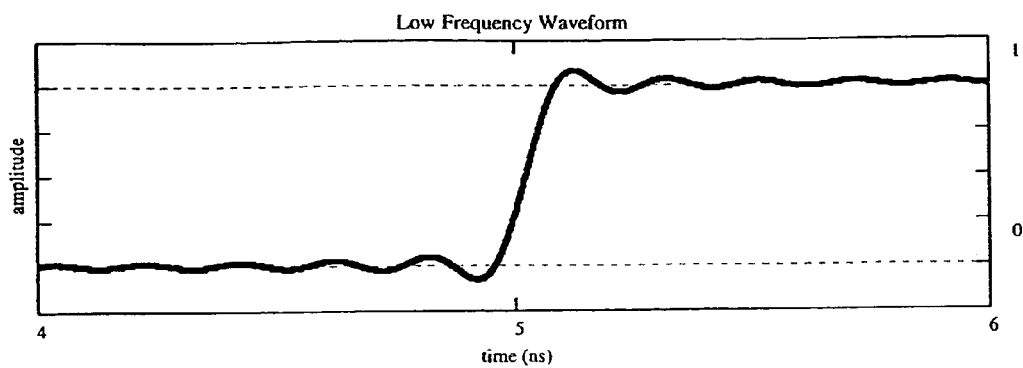
Figure 44:
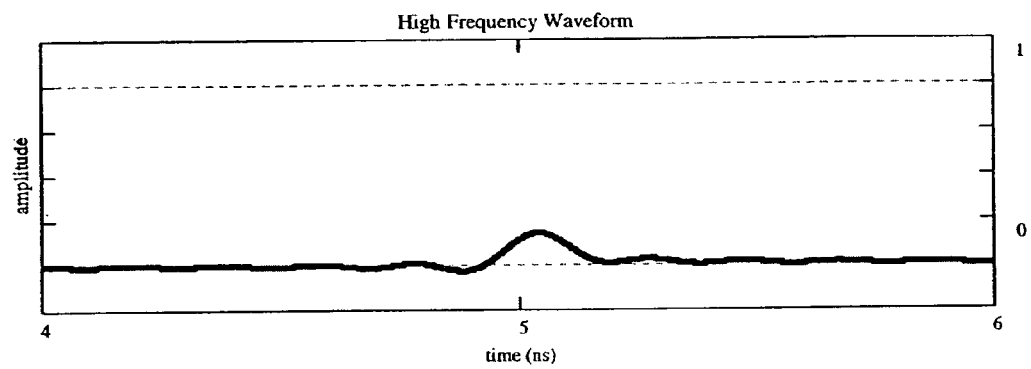
Figure 45:
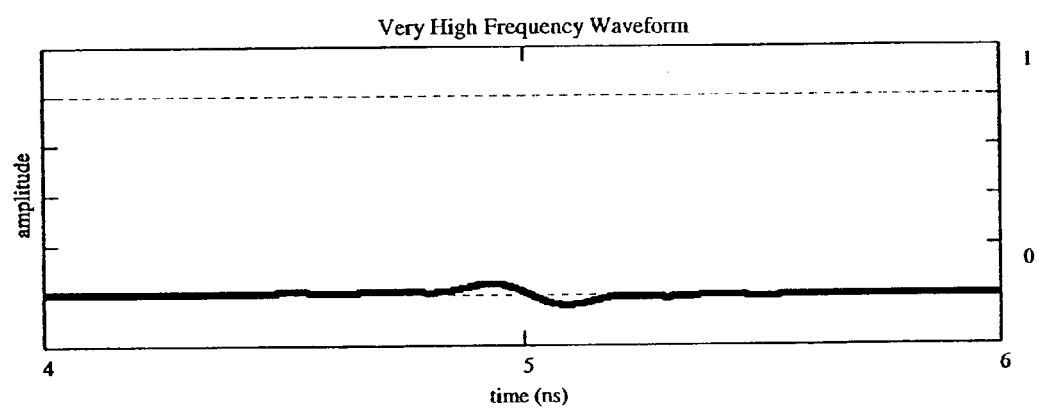

FIGS. 43, 44 and 45 show the low frequency, high frequency, and very high frequency band digitizer input signal due to the processing of the simulated step input signal.

Figure 46:
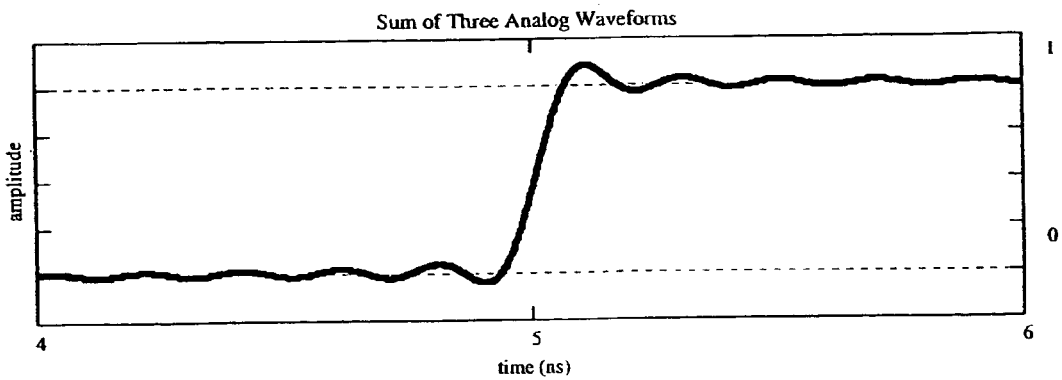

It is interesting to see what the sum of these three waveforms are—there sums to not produce anything good. This is shown in FIG. 46. This is shown to exemplify that further processing of the digitized waveforms is required to achieve the objective.

At this point, the waveforms are digitized. The waveforms must be sampled at a rate sufficient to satisfy Nyquist Criterion. For this example, this means that they must be sampled at least 2 times BW, or 10 GS/s. After the waveforms have been digitized, they are immediately upsampled using SinX/x interpolation. This is possible because all digitized waveforms are bandlimited. It is useful to upsample the waveforms to a sample rate capable of meeting Nyquist Criterion for the system bandwidth—I have chosen 40 GS/s. The upsampling is trivial and for the purpose of this example, I simply use a 40 GS/s digitizer with the understanding that the exact same waveform would result from sampling the waveform at 10 GS/s and upsampling by a factor of 4.

$FS = 40$ Upsampled digitizer sample rate.

$D = \dfrac{FS_{hi}}{FS}$ $\quad D = 25$ Upsampling factor for analog waveform model.

$K = \dfrac{KH}{D}$ $\quad k = 0 \ldots K-1$

Sample the waveforms.

$$t_k = \frac{k}{FS}$$

$$xl_k = xfl_{k \cdot D}$$

$$xh_k = xfhml_{k \cdot D}$$

$$x_k = xh_{k \cdot D}$$

$$w_k = wh_{k \cdot D}$$

$$xhh_k = xfhhml_{k \cdot D}$$

Generally, at this point, we would apply the sharp cutoff filter. If a sharp cutoff analog filter was not used, we'd have to satisfy Nyquist Criterion such that any extra frequency content would not fold back into the 5 GHz band. I've already applied a sharp cutoff filter to the analog signal, so this is not necessary.

Also, at this point, some magnitude and phase compensation would probably be necessary to account for non-ideal channel frequency response characteristics. This example shows the signal digitized with ideal digitizers with ideal frequency response characteristics. Next, the high and very high frequency waveforms are mixed up to there appropriate frequency location and digitally bandpass filtered.

Note that these digital mixers know the phase of the analog mixers—some mechanism must be provided for determining this—either through a pilot tone or locking of the mixer phase to the sample clock.

Apply digital mixers.

$$x_{hm_k} = x_{h_k} \cdot (2 \cdot \cos(2 \cdot \pi \cdot F_{mixer0} t_k + \Phi_{mixer0})) \quad x_{hhm_k} = x_{hh_k} \cdot (2 \cdot \cos(2 \cdot \pi \cdot F_{mixer1} t_k + \Phi_{mixer1}))$$

Bandpass filter the mixer outputs.

$$N = \frac{K}{2} \quad n = 0 \ldots N$$

$$f_n = \frac{n}{N} \cdot \frac{FS}{2}$$

$$Xhm = CFFT(x_{hm}) \quad Xhhm = CFFT(x_{hhm}) \quad Xlm = CFFT(x_l)$$

$$Xfhm_n = \text{if } (f_n > BW, Xhm_n, 0)$$

$$Xfhhm_n = \text{if } (f_n > 2 \cdot BW, Xhhm_n, 0)$$

$$nn = 1 \ldots N-1$$

$$Xfhm_{N+nn} = \overline{Xfhm_{N-nn}} \quad Xfhhm_{N+nn} = \overline{Xfhhm_{N-nn}}$$

$$X_h = CFFT(x_h) \quad X_l = CFFT(x_l) \quad X_{hh} = CFFT(x_{hh})$$

Figure 47:
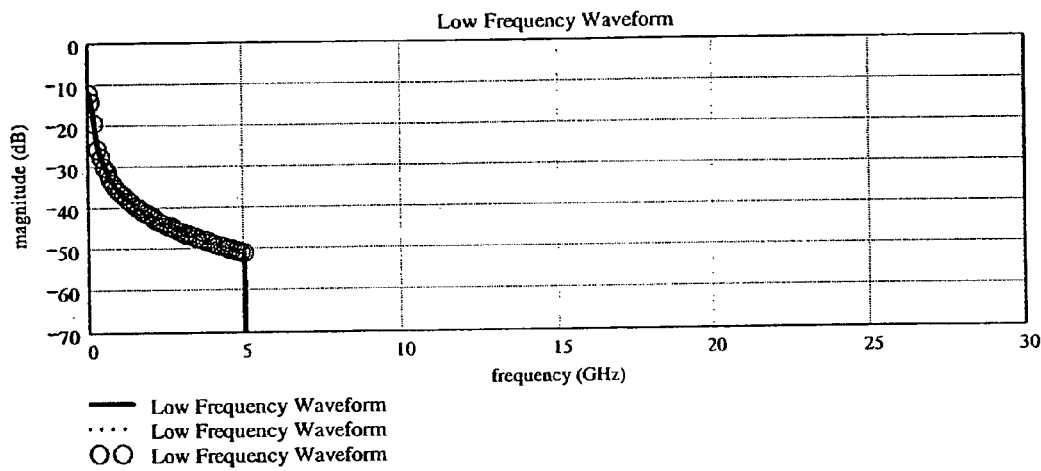

FIG. 47 shows the low frequency band waveform frequency content.

Figure 48:
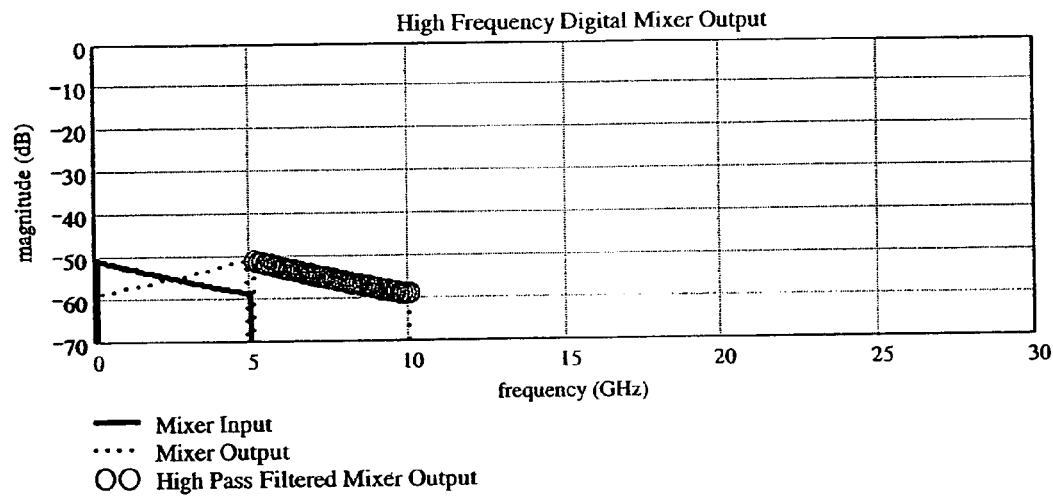

FIG. 48 shows the high frequency band waveform frequency content before and after digital mixing and filtering.

Figure 49:
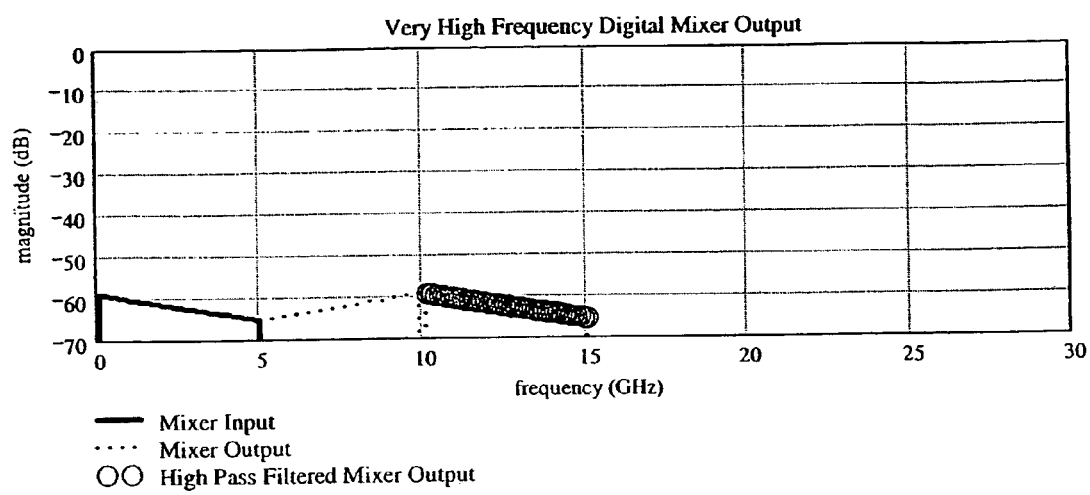

FIG. 49 shows the very high frequency band waveform frequency content before and after digital mixing and filtering.

Figure 50:
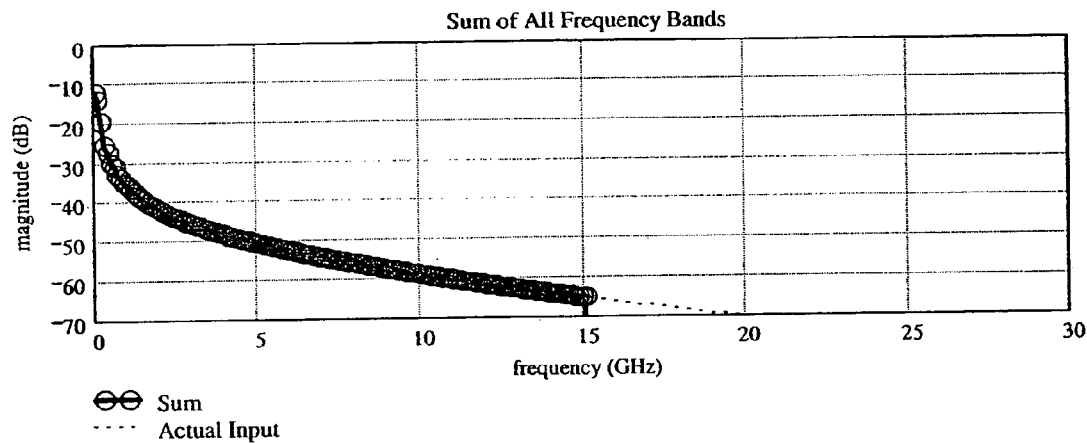

FIG. 50 shows the results of summing the output waveforms. We have acquired the waveform with a 15 GHz bandwidth utilizing three 5 GHz bandwidth channels.

Now let's see how the time domain waveforms compare.

$$xfhm = Re(ICFFT(Xfhm)) \quad xfhhm = Re(ICFFT(Xfhhm))$$

Figure 51:
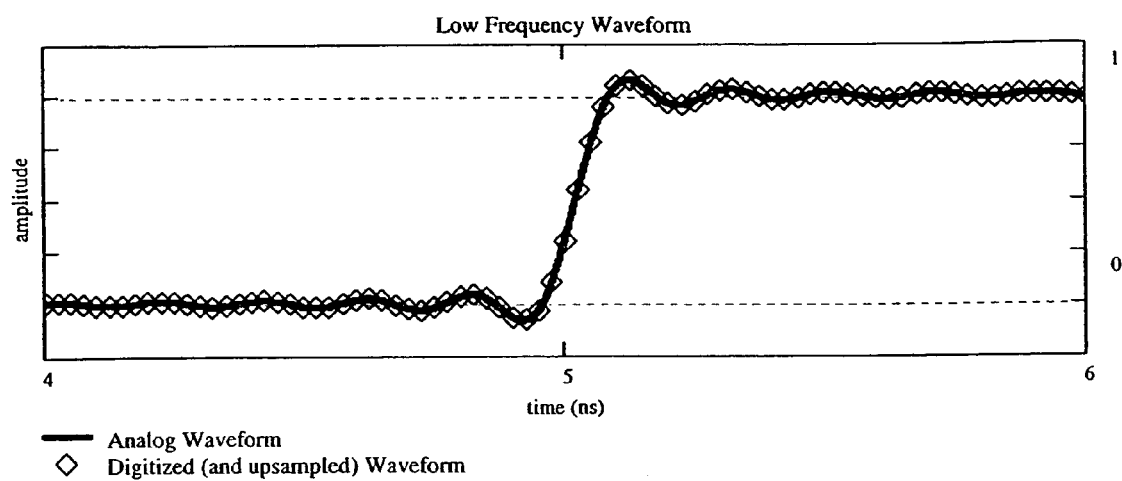

FIG. 51 shows a comparison of the analog low frequency portion of the input waveform to the digitized and processed low frequency waveform result. FIG. 51 shows that these are identical.

Figure 52:
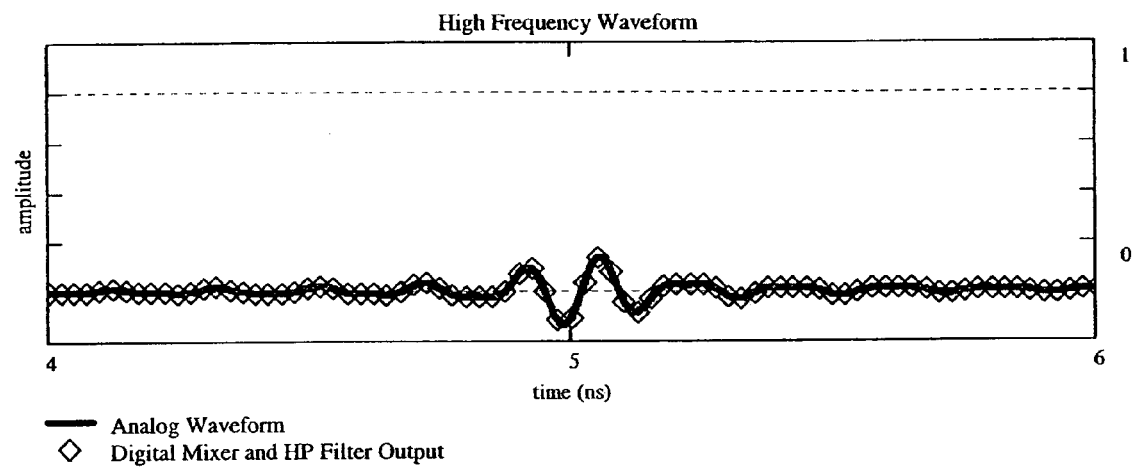

FIG. 52 shows a comparison of the analog high frequency portion of the input waveform to the mixed, digitized and digitally remixed and processed high frequency waveform result. FIG. 52 shows that these are identical.

Figure 53:
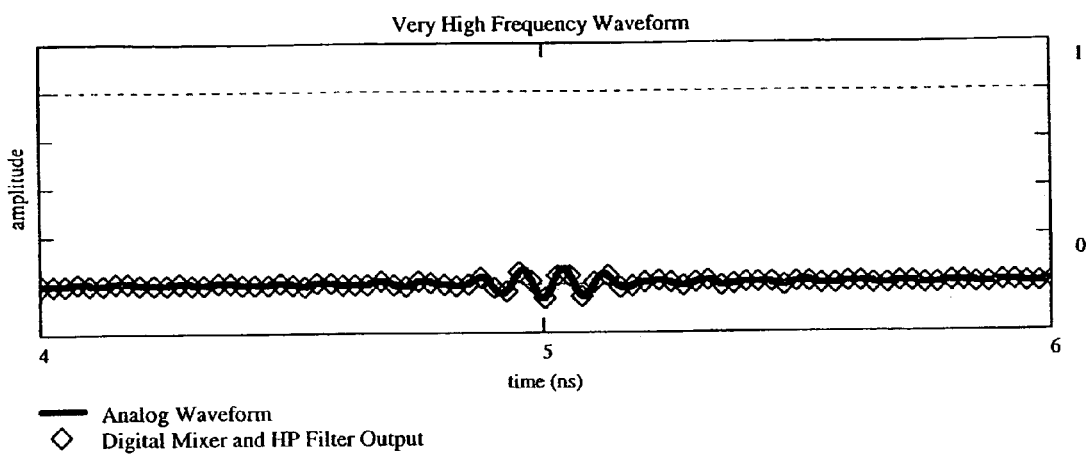

FIG. 53 shows a comparison of the analog very high frequency portion of the input waveform to the mixed, digitized and digitally remixed and processed very high frequency waveform result. FIG. 53 shows that these are identical.

Figure 54:
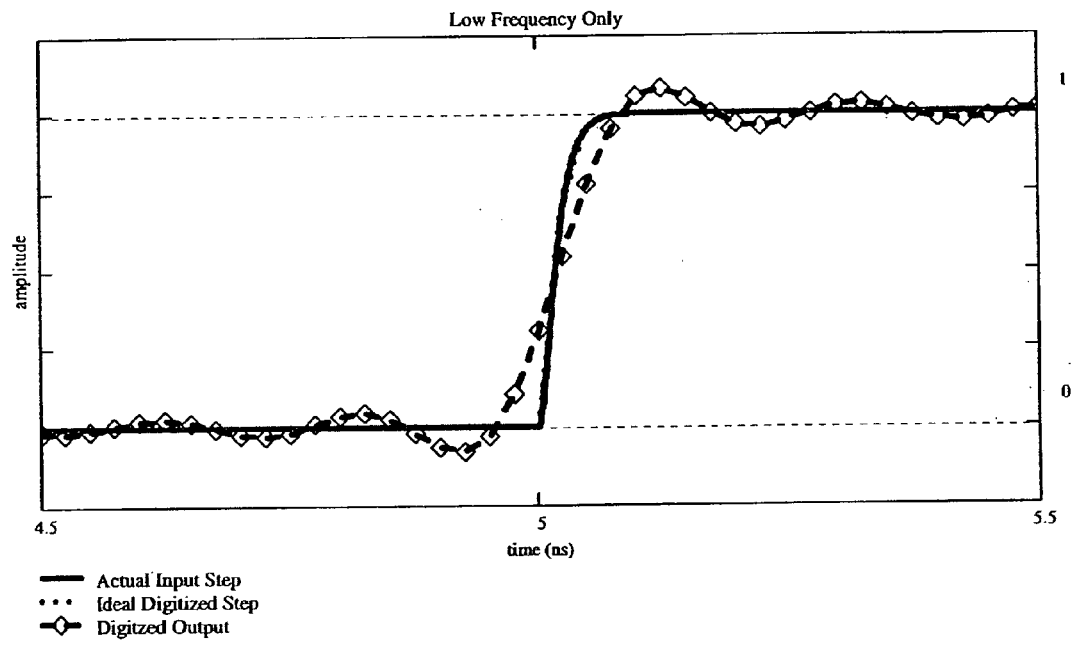
Figure 55:
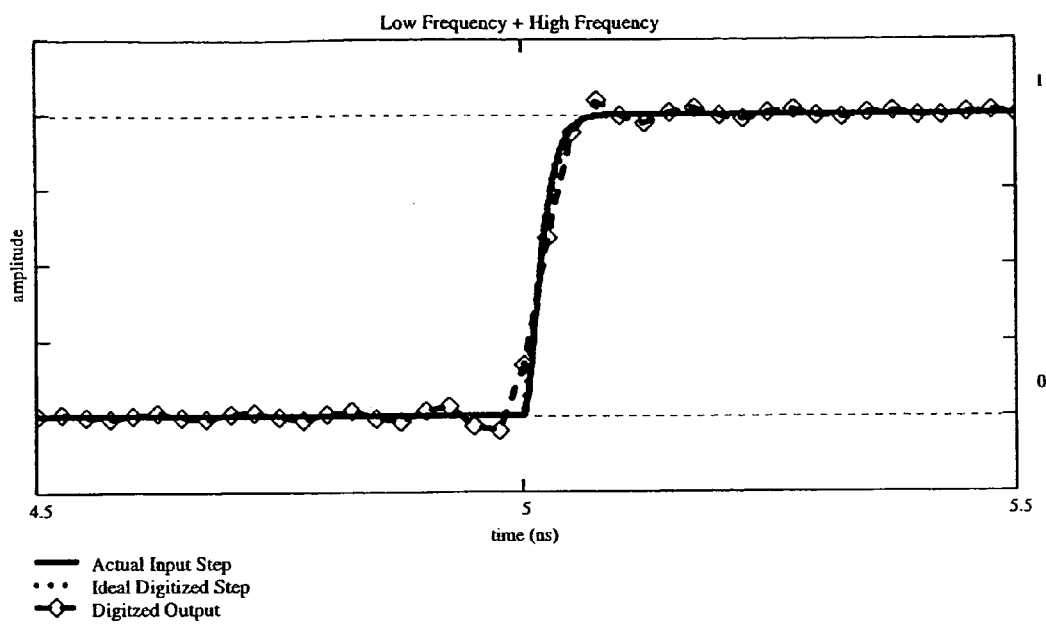
Figure 56:
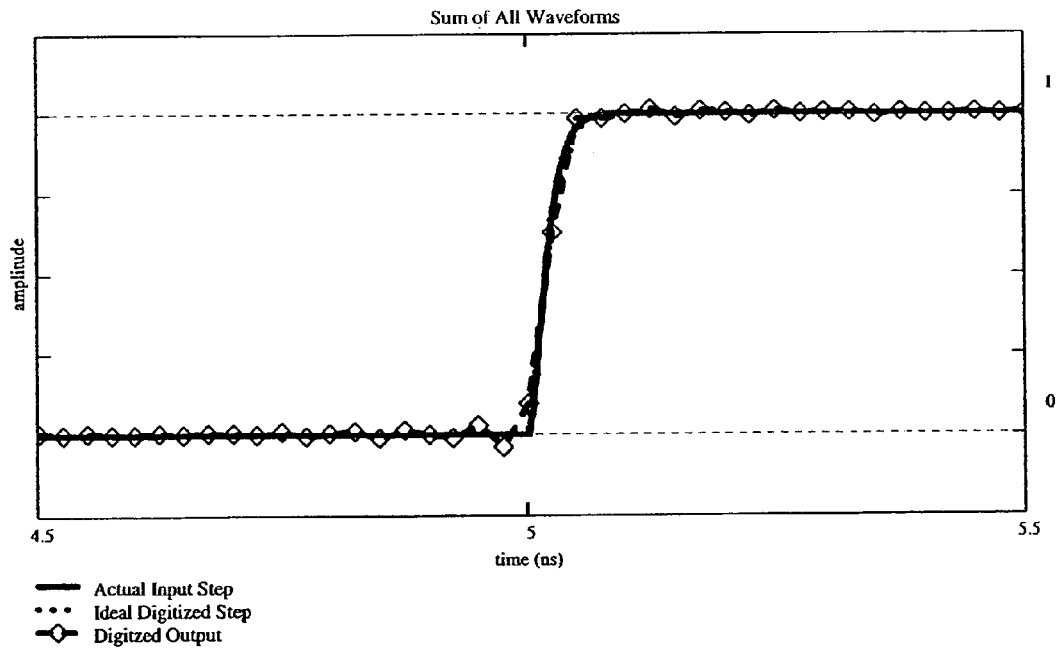

FIGS. 54, 55 and 56 show how successive addition of the processed band outputs causes the resulting waveform to more and more closely approximate the input waveform.

Figure 57:
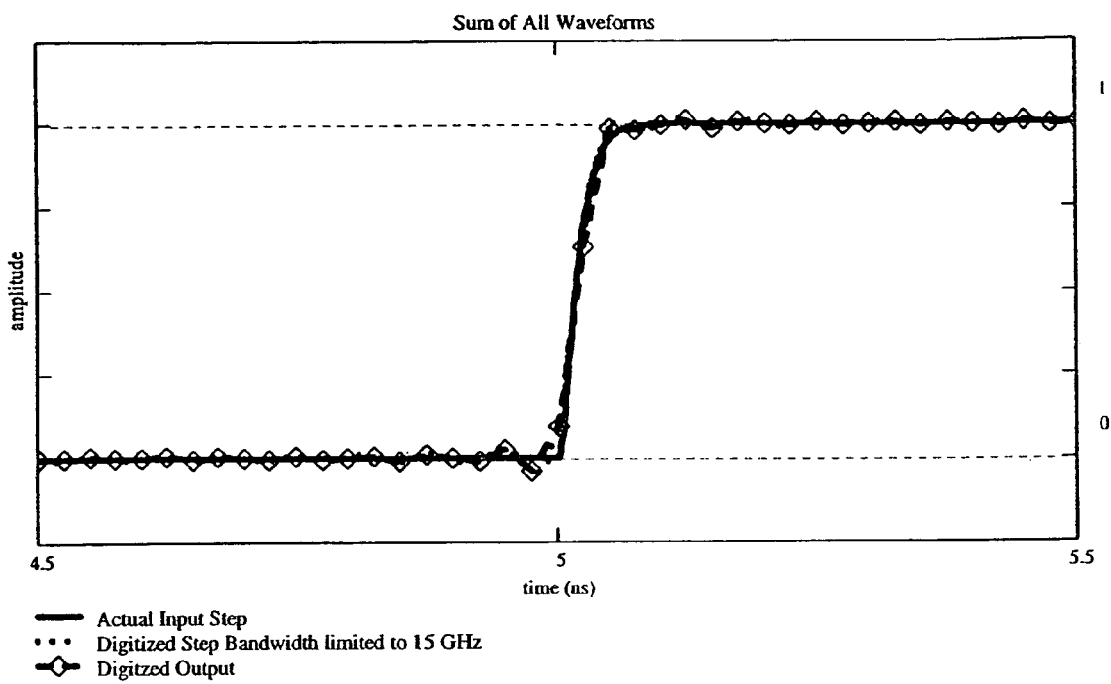

FIG. 57 shows that the result is identical to the input waveform band limited to 15 GHz and shows that the 15 GHz bandwidth limited step is fully recreated.

It should be obvious to one skilled in the art that there are many combinations of translation frequencies and filter choices that will accomplish the objective of this invention. Each has different tradeoffs and implementation considerations depending on the specific application.

It will be understood that the above description of the present invention is susceptible to various modifications, changes and adaptations, and the same are intended to be comprehended within the meaning and range of equivalents of the appended claims. The most obvious modification, for example, is the use of more than two channels.

It will thus be seen that the objects set forth above, among those made apparent from the preceding description, are efficiently attained and, since certain changes may be made in carrying out the above method (process) without departing from the spirit and scope of the invention, it is intended that all matter contained in the above description shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method for digitizing a signal, comprising the steps of:
   receiving an analog signal spanning a frequency range;
   splitting the received analog signal into a plurality of split signals, each split signal spanning a frequency range smaller than the original frequency range;
   translating the frequency range of at least one of the split signals;
   digitizing each of said split signals;
   converting the frequency range of the at least one translated split signal back to the original frequency range of the corresponding split signal;
   equalizing each of said split signals to compensate for non-ideal magnitude and phase characteristics resulting from processing the received analog signal and digitized split signals; and
   combining said digitized split signals to form a single output data stream.

2. The method of claim 1, wherein the translating is accomplished by sampling action of a digitizer used for digitizing said at least one split signal.

3. The method of claim 1, wherein the frequency range of at least one of the split signals is translated by mixing with a low-distortion sinusoid.

4. A method for digitizing a signal, comprising the steps of:
   receiving an analog signal spanning a frequency range;
   splitting the received analog signal into a plurality of split signals, each split signal spanning a frequency range smaller than the original frequency range;
   band limiting each of the split signals to a corresponding one of a plurality of predetermined band ranges;
   translating the frequency range of at least one of the band-limited split signals;
   digitizing each of said split signals;
   passing the translated at least one split signal through an image reject filter, having a predetermined passband;
   converting the frequency range of the at least one translated split signal back to the original frequency range of the corresponding split signal; and
   combining said digitized split signals to form a single output data stream;
   wherein the predetermined passband comprises an intrinsic bandwidth of a channel used for digitizing said translated at least one spilt signal.

5. A method for digitizing a signal, comprising the steps of:
   receiving an analog signal; splitting the received analog signal into channels having a low frequency split signal and a high frequency split signal respectively;
   mixing said high frequency split signal with a predetermined periodic function with a predetermined frequency;
   band limiting each of the split signals to a predetermined band range;
   digitizing said split signals;
   mixing said digitized high frequency split signal with a second predetermined periodic function with said predetermined frequency, resulting in two images of said high frequency split signal at different frequencies;
   passing said mixed, digitized high frequency split signal through an image reject filter, having a second predetermined frequency, to remove an unwanted lower frequency from one of the two images; and
   combining said digitized low frequency split signal and the high frequency image of the digitized high frequency split signal to form a single output data stream.

6. The method of claim 5, further comprising the step of equalizing the low frequency and the high frequency split signals separately to compensate for non-ideal magnitude and phase characteristics introduced by front-end systems for each channel.

7. The method of claim 5, wherein said predetermined periodic functions are low-distortion sinusoids.

8. An apparatus for digitizing a signal, comprising:
   an input adapted to receive an analog signal spanning a frequency range;
   a splitter adapted to receive the analog signal and split the received analog signal into a plurality of split signals, each split signal spanning a frequency range smaller than the original frequency range;
   a first mixer to translate the frequency range of at least one of the split signals;
   a digitizer to digitize each of said split signals;
   a second mixer to translate the frequency range of the at least one digitized translated split signal back to the original frequency range prior to translating the frequency range of said at least one split signal; and
   a combining unit for combining said digitized split signals to form a single output data stream.

9. The apparatus of claim 8, further comprising an equalizer to equalize each of said digitized split signals to compensate for non-ideal magnitude and phase characteristics resulting from processing the received analog signal and digitized split signals.

10. The apparatus of claim 8, further comprising a band limiter for band limiting each of the split signals to a corresponding one of a plurality of predetermined band ranges before translating.

11. The apparatus of claim 8, further comprising an image reject filter having a predetermined passband for receiving and passing the translated split signal.

12. The apparatus of claim 11, wherein the predetermined passband comprises an intrinsic bandwidth of a channel used for digitizing said translated split signal.

13. The apparatus of claim 8, wherein said translating by said first mixer is accomplished by a sampling action of a digitizer used for digitizing said at least one split signal.

14. The apparatus of claim 8, wherein at least one of the first and second mixers uses a low-distortion sinusoid for frequency translation.

15. An apparatus for digitizing a signal, comprising:
an input adapted to receive an analog signal;
a splitter adapted to receive the analog signal, and to split the received analog signal into channels having a low frequency split signal and a high frequency split signal respectively;
a first mixer to mix said high frequency split signal with a predetermined periodic function with a predetermined frequency;
a band limiter adapted to band limit each of the split signals to a predetermined band range;
a digitizer to digitize said split signals;
a second mixer to mix said digitized high frequency split signal with a second predetermined periodic function with said predetermined frequency, resulting in two images of said digitized high frequency split signal at different frequencies;
an image reject filter, having a second predetermined frequency, for receiving and passing said digitized high frequency split signal to remove an unwanted lower frequency from one of the two images; and
a combining unit to combine said digitized low frequency split signal and said high frequency image of said digitized high frequency split signal to form a single output data stream that is a substantially correct digital representation of the received analog signal.

16. The apparatus of claim 15, further comprising an equalizer for equalizing the high frequency and the low frequency split signals separately to compensate for non-ideal magnitude and phase characteristics introduced by front-end systems for each channel.

17. The apparatus of claim 15, wherein said predetermined periodic functions are low-distortion sinusoids.

18. A method for digitizing a signal, comprising the steps of:
receiving an analog signal spanning a frequency range;
splitting the received analog signal into a plurality of split signals, each split signal spanning a frequency range smaller than the original frequency range;
translating the frequency range of at least one of the split signals;
digitizing each of said split signals;
converting the frequency range of the at least one translated split signal back to the original frequency range of the corresponding split signal; and
combining said digitized split signals to form a single output data stream that is a substantially correct representation of the received analog signal over substantially the original frequency range.

* * * * *